US009602745B2

(12) United States Patent
Nishihara

(10) Patent No.: US 9,602,745 B2
(45) Date of Patent: Mar. 21, 2017

(54) IMAGING DEVICE, IMAGING APPARATUS, ELECTRONIC APPARATUS, THRESHOLD VALUE CALCULATION APPARATUS, AND IMAGING METHOD

(71) Applicant: SONY SEMICONDUCTOR SOLUTIONS CORPORATION, Kanagawa (JP)

(72) Inventor: Toshiyuki Nishihara, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 14/649,396

(22) PCT Filed: Nov. 29, 2013

(86) PCT No.: PCT/JP2013/082165
§ 371 (c)(1),
(2) Date: Jun. 3, 2015

(87) PCT Pub. No.: WO2014/097857
PCT Pub. Date: Jun. 26, 2014

(65) Prior Publication Data
US 2016/0219234 A1    Jul. 28, 2016

(30) Foreign Application Priority Data

Dec. 20, 2012 (JP) ................................ 2012-277560
Apr. 2, 2013 (JP) ................................ 2013-077071

(51) Int. Cl.
*H01J 40/14* (2006.01)
*H04N 5/374* (2011.01)
(Continued)

(52) U.S. Cl.
CPC ................ *H04N 5/374* (2013.01); *G01J 1/44* (2013.01); *H01L 27/14609* (2013.01);
(Continued)

(58) Field of Classification Search
CPC ........ G01J 2001/442; G01J 2001/4433; H04N 5/3355; H04N 5/37455
(Continued)

(56) References Cited

U.S. PATENT DOCUMENTS 8,039,784 B2 * 10/2011 Schmitt ............... H01L 27/1446
250/214 R

FOREIGN PATENT DOCUMENTS

EP    2302905    3/2011
EP    2840777    2/2015
(Continued)

OTHER PUBLICATIONS

International Search Report prepared by the Japanese Patent Office on Feb. 21, 2014, for International Application No. PCT/JP2013/082165.
(Continued)

*Primary Examiner* — Thanh Luu
(74) *Attorney, Agent, or Firm* — Sheridan Ross P.C.

(57) ABSTRACT

The accuracy of a binary decision on a photon incident on a pixel is improved.

An imaging device includes a generation unit and a decision unit. The generation unit generates a digital value indicating the amount of charge stored by photons incident on a pixel during an exposure period based on a signal output by the pixel. The decision unit compares a threshold value set for each pixel having similar conversion efficiency at the time of conversion of the amount of charge stored in the pixel into a digital value generated by the generation unit, with the generated digital value, and makes a decision on the entrance of a photon into the pixel that output the signal.

16 Claims, 22 Drawing Sheets

(51) Int. Cl.
      *H04N 5/378*      (2011.01)
      *H01L 27/146*    (2006.01)
      *G01J 1/44*        (2006.01)
      *H04N 3/14*       (2006.01)

(52) U.S. Cl.
    CPC ....... H01L 27/14612 (2013.01); H04N 3/155 (2013.01); H04N 5/378 (2013.01)

(58) Field of Classification Search
    USPC .................................................... 250/214 R
    See application file for complete search history.

(56) References Cited

FOREIGN PATENT DOCUMENTS

| | | |
|---|---|---|
| JP | 11-136580 A | 5/1999 |
| JP | 2009-253683 A | 10/2009 |
| JP | 2011-097581 | 5/2011 |
| WO | WO 2012/017762 | 2/2012 |
| WO | WO 2012/077218 | 6/2012 |

OTHER PUBLICATIONS

Extended European Search Report for European Patent Application No. 13865603.8 dated Sep. 20, 2016, 11 pages.

\* cited by examiner

FIG. 5

| PIXEL POSITION | ADJUSTMENT VALUE |
|---|---|
| PIXEL (1, 1) | 7 |
| PIXEL (1, 2) | 3 |
| PIXEL (1, 3) | 12 |
| ⋮ | ⋮ |
| PIXEL (128, 128) | 5 | a

| ADJUSTMENT VALUE | GRADATION |
|---|---|
| 0 | 5 |
| 1 | 10 |
| 2 | 15 |
| ⋮ | ⋮ |
| 15 | 80 | b

FIG. 7
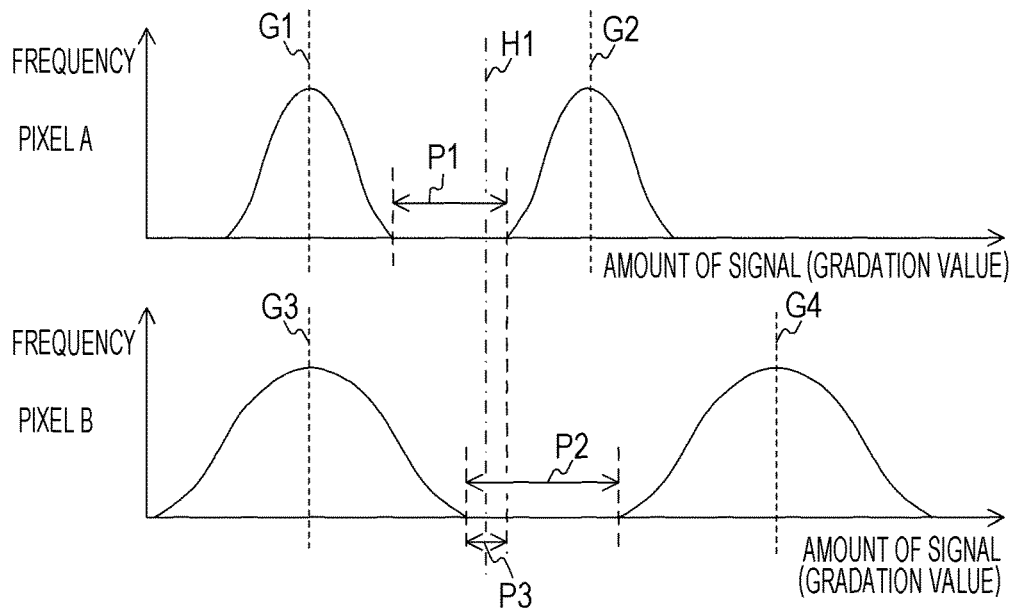
a
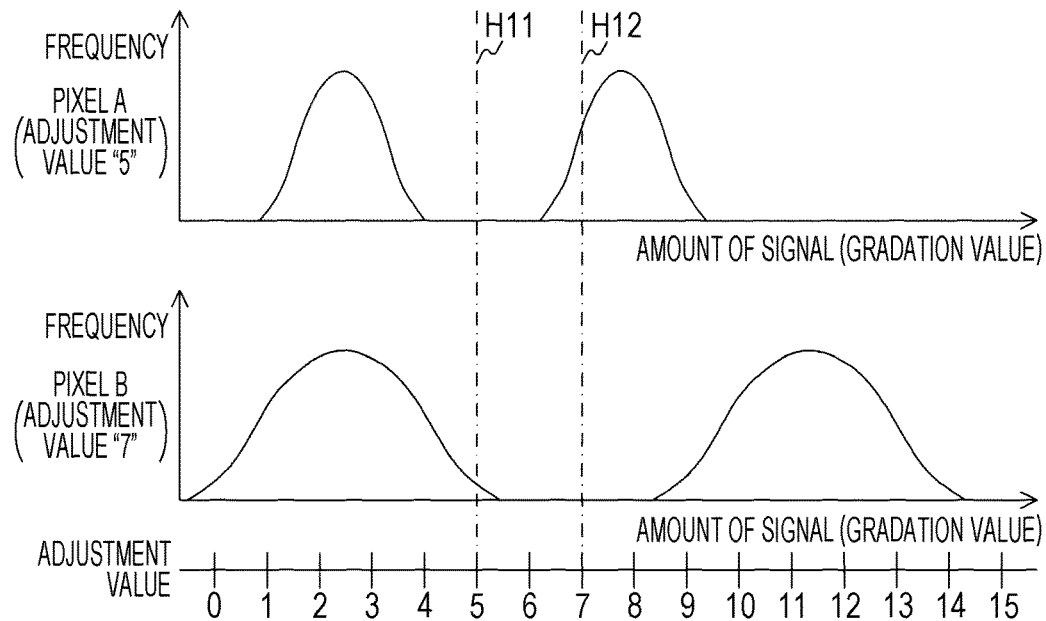
b

FIG. 9
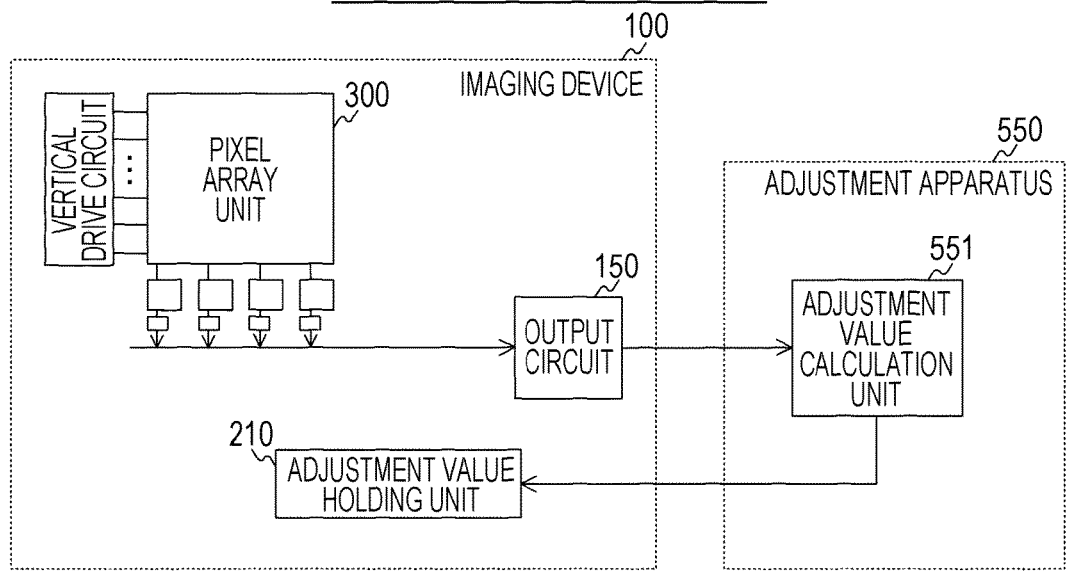
a
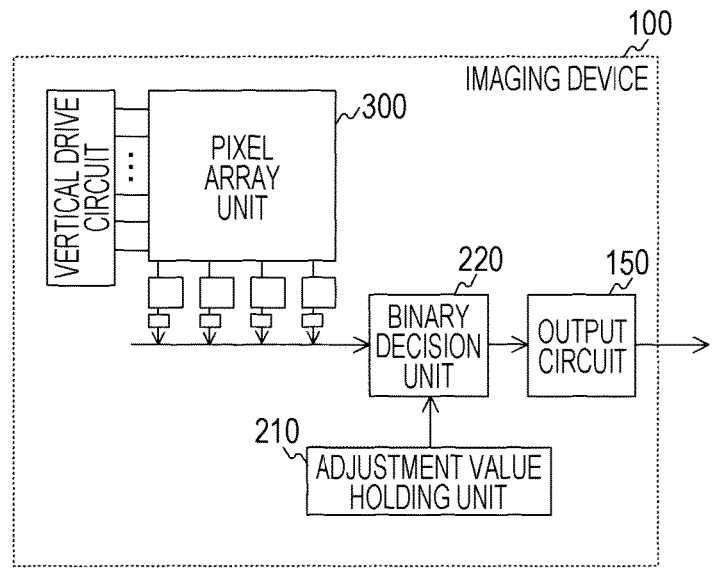
b

FIG. 10
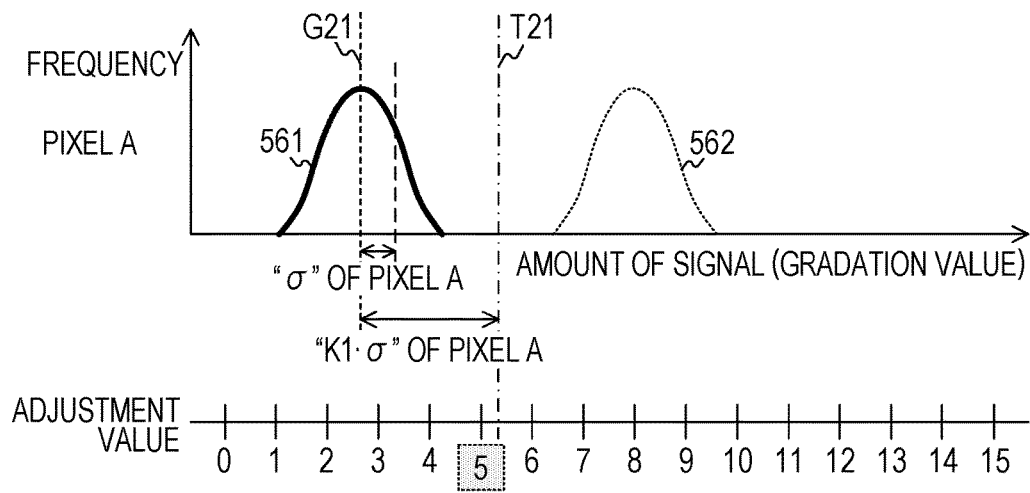
a
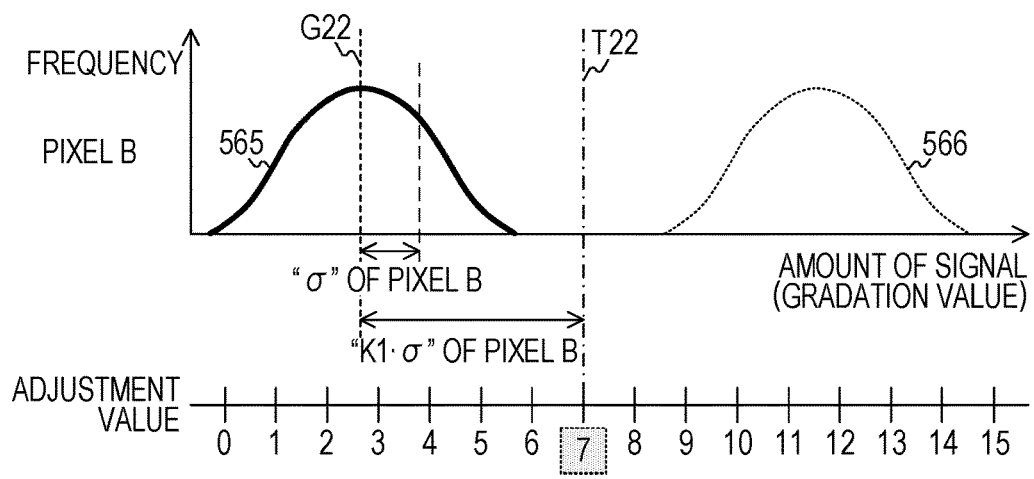
b

*FIG. 15*

| | NOT AMPLIFIED (ANOTHER IMAGING DEVICE) | AMPLIFIED (IMAGING DEVICE 100) |
|---|---|---|
| POTENTIAL DIFFERENCE OF STEP HEIGHT OF RAMP WAVEFORM OF REF SIGNAL | REFERENCE (×1) | N TIMES (×N) |
| SCAN TARGET POTENTIAL DIFFERENCE IN RESET SIGNAL COUNT PERIOD | REFERENCE (×1) | REFERENCE (×1) |
| NUMBER OF STEPS IN RESET SIGNAL COUNT PERIOD | REFERENCE (×1) | 1/N TIMES (×1/N) |
| TIME LENGTH OF RESET SIGNAL COUNT PERIOD | REFERENCE (×1) | 1/N TIMES (×1/N) | a

| | NOT AMPLIFIED (ANOTHER IMAGING DEVICE) | AMPLIFIED (IMAGING DEVICE 100) |
|---|---|---|
| POTENTIAL DIFFERENCE OF STEP HEIGHT OF RAMP WAVEFORM OF REF SIGNAL | REFERENCE (×1) | N TIMES (×N) |
| SCAN TARGET POTENTIAL DIFFERENCE IN STORAGE SIGNAL COUNT PERIOD | REFERENCE (×1) | · ONE CORRESPONDING TO POTENTIAL DIFFERENCE FOR DETECTING OFFSET COMPONENTS OF COMPARATOR IS SAME (×1)<br>· ONE CORRESPONDING TO POTENTIAL DIFFERENCE FOR DETECTING STORAGE SIGNAL IS N TIMES (×N) |
| NUMBER OF STEPS IN STORAGE SIGNAL COUNT PERIOD | REFERENCE (×1) | · ONE CORRESPONDING TO NUMBER OF STEPS FOR DETECTING OFFSET COMPONENTS OF COMPARATOR IS 1/N TIMES (×1/N)<br>· ONE CORRESPONDING TO NUMBER OF STEPS FOR DETECTING STORAGE SIGNAL IS SAME (×1) |
| TIME LENGTH OF STORAGE SIGNAL COUNT PERIOD | REFERENCE (×1) | · ONE CORRESPONDING TO TIME LENGTH FOR DETECTING OFFSET COMPONENTS OF COMPARATOR IS 1/N TIMES (×1/N)<br>· ONE CORRESPONDING TO TIME LENGTH FOR DETECTING STORAGE SIGNAL IS SAME (×1) | b

IMAGING DEVICE, IMAGING APPARATUS, ELECTRONIC APPARATUS, THRESHOLD VALUE CALCULATION APPARATUS, AND IMAGING METHOD

CROSS REFERENCE TO RELATED APPLICATIONS

This application is a national stage application under 35 U.S.C. 371 and claims the benefit of PCT Application No. PCT/JP2013/082165 having an international filing date of Nov. 29, 2013, which designated the United States, which PCT application claimed the benefit of Japanese Patent Application No. 2012-277560 filed Dec. 20, 2012, and Japanese Patent Application No. 2013-077071 filed Apr. 2, 2013, the disclosures of which are incorporated herein by reference in their entirety.

TECHNICAL FIELD

The present technology relates to an imaging device. Specifically, the present technology relates to an imaging device for detecting faint light, an imaging apparatus, an electronic apparatus, a threshold value calculation apparatus of the imaging device for detecting faint light, and an imaging method.

BACKGROUND ART

An apparatus that detects faint light has widely been introduced mainly in the medical and research fields in recent years. In such an apparatus, a photomultiplier tube, which is relatively expensive, is used as a detection unit of faint light in many cases.

Moreover, an apparatus is also proposed which detects faint light using an imaging device such as a CMOS (Complementary Metal Oxide Semiconductor) image sensor, which can be manufactured at low cost, instead of the photomultiplier tube (see, for example, Patent Document 1).

CITATION LIST

Patent Document

Patent Document 1: Japanese Patent Application Laid-Open No. 2011-97581

SUMMARY OF THE INVENTION

Problems to be Solved by the Invention

In the above-mentioned known technology, the number of photons incident on each pixel of a CMOS image sensor is counted (photon counting) to detect faint light.

In the above-mentioned known technology, a binary decision is made on the entrance or non-entrance of a photon into each pixel. The binary decision is made considering, for example, the difference of the characteristic of each pixel and the influence of random noise and the like. Therefore, a further reduction in the judgment error of a binary decision can be expected.

The present technology has been made considering such circumstances, and an object thereof is to improve the accuracy of a decision on a photon incident on a pixel.

Solutions to Problems

A present technology has been made for resolving the above-described problem, and a first aspect thereof is an imaging device, imaging apparatus, electronic apparatus, and imaging method including: a generation unit for generating a digital value indicating the amount of charge stored by photons incident on a pixel during an exposure period, based on a signal output by the pixel; and a decision unit for comparing a threshold value set for each pixel having similar conversion efficiency at the time of conversion of the amount of charge stored in the pixel into a digital value generated by the generation unit, with the generated digital value, and making a decision on the entrance of a photon into the pixel that output the signal. Consequently, it effects the operation that the threshold value set for each pixel having similar conversion efficiency at the time of conversion into a digital value is compared with the digital value to decide on the entrance of a photon.

Moreover, this first aspect may further include an amplification unit for amplifying the signal at a factor greater than one, wherein the generation unit may perform the generation based on the amplified signal. Consequently, it effects the operation that the digital value is generated based on a signal amplified by the amplification unit that amplifies a signal at a factor greater than one, and the generated digital value is compared with the threshold value to make a decision on the entrance of a photon.

Moreover, in this first aspect, the amplification unit may be provided to each pixel, and the decision unit may set a factor at the time of the amplification of the signal as the conversion efficiency, and uses a threshold value set for each pixel to make the decision. Consequently, it effects the operation that the digital value is generated based on a signal amplified by the amplifier unit provided to each pixel, and the generated digital value is compared with the threshold value to make a decision on the entrance of a photon.

Moreover, in this first aspect, the amplification unit may include a common-source amplifier transistor provided to each pixel. Consequently, it effects the operation that the digital value is generated based on a signal amplified by the common-source amplifier transistor provided to each pixel, and the generated digital value is compared with the threshold value to make a decision on the entrance of a photon.

Moreover, in this first aspect, the amplification units may be provided on a column basis to the pixels arranged in matrix form, and the decision unit may set a factor at the time of the amplification of the signal as the conversion efficiency, and uses a threshold value set on the column basis to make the decision. Consequently, it effects the operation that the digital value is generated based on a signal amplified by the amplification unit provided to each column, and the generated digital value is compared with the threshold value set for each column to make a decision on the entrance of a photon.

Moreover, in this first aspect, the amplification unit may include an operational amplifier or CMOS (Complementary Metal Oxide Semiconductor) inverter. Consequently, it effects the operation that the amplification unit including an operational amplifier or CMOS (Complementary Metal Oxide Semiconductor) inverter is provided.

Moreover, in this first aspect, the amplification unit in the imaging device includes a feedback circuit for feeding a potential of the signal back to a potential of a floating diffusion of the pixel that output the signal. Consequently, it effects the operation that the amplification unit including a feedback circuit is provided.

Moreover, this first aspect may further include a holding unit for holding a threshold value specifying value for specifying the threshold value with the number of bits less than the number of bits required to indicate the digital value generated by the generation unit, for each pixel having the similar conversion efficiency, wherein the decision unit may acquire the threshold value specifying value of the pixel that output the signal converted into the digital value targeted for the decision, converts the acquired threshold value specifying value into a gradation value of the digital value based on a table indicating the association between the digital value and the threshold value specifying value, and sets the threshold value. Consequently, it effects the operation that the threshold value specifying value held by the holding unit is converted into a gradation value of a digital value to set a threshold value.

Moreover, in this first aspect, the threshold value may be calculated based on a standard deviation and an average value, which are calculated from a plurality of digital values acquired by acquiring a digital value obtained by converting a reset signal being a signal in a state where there is no charge stored by a photon, a plurality of times, for each pixel having the similar conversion efficiency. Consequently, it effects the operation that the threshold value is calculated based on the standard deviation and average value of the digital values obtained by converting the reset signals.

Moreover, a second aspect of the present technology is an imaging apparatus including: a generation unit for generating a digital value indicating the amount of charge stored by photons incident on a pixel during an exposure period based on a signal output by the pixel; and a decision unit for comparing a threshold value set for each pixel having similar conversion efficiency at the time of conversion of the amount of charge stored in the pixel into a digital value generated by the generation unit, with the generated digital value, and making a decision on the entrance of a photon into the pixel that output the signal. Consequently, it effects the operation that a threshold value set for each pixel having similar conversion efficiency at the time of conversion into a digital value is compared with the digital value to decide on the entrance of a photon.

Moreover, this second aspect may further include a calculation unit for calculating the threshold value based on a standard deviation and average value of a plurality of digital values acquired by acquiring a digital value obtained by converting a reset signal being a signal in a state where there is no charge stored by a photon, a plurality of times, for each pixel having the similar conversion efficiency. Consequently, it effects the operation that the threshold value is calculated based on the standard deviation and average value of the digital values obtained by converting the reset signals.

Moreover, a third aspect of the present technology is an electronic apparatus including: a generation unit for generating a digital value indicating the amount of charge stored by photons incident on a pixel during an exposure period based on a signal output by the pixel; and a decision unit for comparing a threshold value set for each pixel having similar conversion efficiency at the time of conversion of the amount of charge stored in the pixel into a digital value generated by the generation unit, with the generated digital value, and making a decision on the entrance of a photon into the pixel that output the signal. Consequently, it effects the operation that the threshold value is calculated based on the standard deviation and average value of the digital values.

Moreover, in this third aspect, the signal may be a reset signal in a state where there is no charge stored by a photon. Consequently, it effects the operation that the threshold value is calculated based on the standard deviation and average value of the digital values generated from the reset signals in a state where there is no charge stored by a photon.

Moreover, in this third aspect, the signal may be a signal in a state where there is no charge stored by a photon, the acquisition unit may execute the process of acquiring the digital value generated by the exposed imaging device, a plurality of times, with different amounts of exposure, and the calculation unit may calculate the threshold value from the standard deviation and average value obtained for each amount of exposure. Consequently, it effects the operation that the threshold value is calculated from the standard deviation and average value obtained for each amount of exposure.

Effects of the Invention

The present technology can achieve an excellent effect that the accuracy of a decision on a photon incident on a pixel can be improved.

BRIEF DESCRIPTION OF DRAWINGS

FIGS. 5a and 5b are diagrams for explaining adjustment values held by an adjustment value holding unit 210 of the first embodiment of the present technology.

FIGS. 7a and 7b are diagrams schematically illustrating the effect of making a binary decision using a pixel-specific adjustment value held by the adjustment value holding unit 210 of the embodiment of the present technology.

FIGS. 9a and 9b are functional configuration diagrams for explaining an example of a method for calculating adjustment values when causing the adjustment value holding unit 210 of the imaging device 100 to hold the adjustment values in the first embodiment of the present technology.

FIGS. 10a and 10b are diagrams schematically illustrating the calculation of adjustment values by an adjustment value calculation unit 551 in the embodiment of the present technology.

FIGS. 15a and 15b are tables for comparing a ramp waveform of a REF signal in the first modification of the first embodiment of the present technology with a ramp waveform of a REF signal in the other imaging device.

MODES FOR CARRYING OUT THE INVENTION

Hereinafter, modes for carrying out the present technology (hereinafter referred to as the embodiments) are described. Descriptions are given in the following order:

1. First Embodiment (imaging control: an example where a threshold value for each pixel is used to make a binary decision on the entrance of a photon), and 2. Second Embodiment (imaging control: an example where a threshold value for each pixel is obtained from a digital value of an exposed pixel).

1. First Embodiment

A Configuration Example of an Imaging Device

Figure 1:
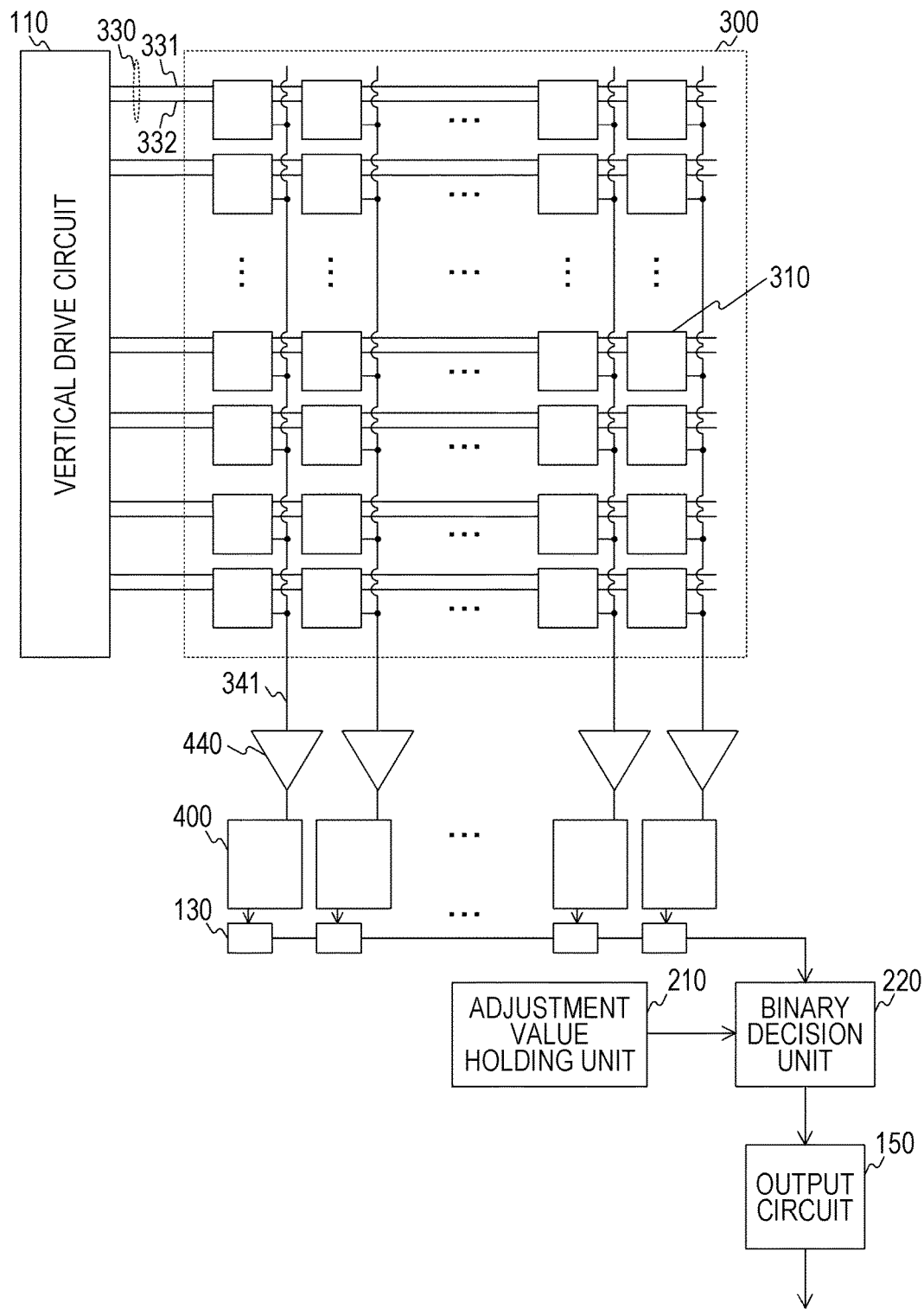
FIG. 1 is a conceptual diagram illustrating an example of a basic configuration example of an imaging device 100 of a first embodiment of the present technology.

FIG. 1 is a conceptual diagram illustrating an example of a basic configuration example of an imaging device 100 of a first embodiment of the present technology.

The imaging device 100 is a photodetector provided to a system for detecting faint light (for example, a fluorescence scanner of an imaging plate, and a radiation scintillation counter). The imaging device 100 is fabricated of, for example, a CMOS (Complementary Metal Oxide Semiconductor) sensor. The imaging device 100 is used instead of a known photomultiplier tube, avalanche photodiode, photodiode, or the like.

The imaging device 100 includes a pixel array unit 300, a vertical drive circuit 110, an amplifier unit 440, a digital value generation circuit 400, a resistor 130, an adjustment value holding unit 210, a binary decision unit 220, and an output circuit 150.

The pixel array unit 300 includes a plurality of pixels (pixels 310) arranged in two-dimensional matrix form (n×m). In the first embodiment of the present technology, the pixels 310 of 128 rows×128 columns are assumed to be arranged in the pixel array unit 300. In the pixel array unit 300 illustrated in FIG. 1, part of the pixels 310 of 128 rows×128 columns is illustrated. Control lines (control lines 330) are wired, row by row, from the vertical drive circuit 110 to the pixels 310 arranged in the pixel array unit 300. Moreover, vertical signal lines (vertical signal lines 341) are wired, column by column (column by column), to the pixels 310. The circuit configuration of the pixel 310 is described with reference to FIG. 2. Therefore, its description is omitted here.

The vertical drive circuit 110 supplies signals to the pixels 310 via the control lines 330 and sequentially selects and scans the pixels 310, one row at a time, in the vertical direction (column direction). Selective scanning is performed, one row at a time, by the vertical drive circuit 110. Accordingly, signals are output from the pixels 310, one row at a time. The control line 330 includes a pixel reset line 331 and a charge transfer line 332. The pixel reset line 331 and the charge transfer line 332 are described with reference to FIG. 2. Therefore, their descriptions are omitted here.

The amplifier unit 440 amplifies a signal output by the pixel 310 by N times (a factor greater than one (N>1). The amplifier unit 440 is fabricated of, for example, an operational amplifier connected between the pixel 310 and the digital value generation circuit 400. Moreover, if the amplification factor of an amplifier transistor of the pixel 310 is large, the operational amplifier is not connected between the pixel 310 and the digital value generation circuit 400, and the amplifier unit 440 is fabricated of the amplifier transistor of the pixel 310. Various examples of the amplifier unit 440 are described with reference to FIGS. 10a to 20 as modifications of the first embodiment of the present technology. Therefore, their detailed descriptions are omitted here. Here, a description is given assuming the operational amplifier connected between the pixel 310 and the digital value generation circuit 400 (see, for example, FIG. 12).

If the amplifier unit 440 is fabricated of an operational amplifier, the difference between a reference voltage set arbitrarily and a signal output by the pixel 310 (a reset signal or storage signal) is amplified and output by the amplifier unit 440, using a resistive divider or capacitive divider. The amplifier unit 440 is provided between the pixel 310 and the digital value generation circuit 400, or is an amplifier transistor of a pixel. Accordingly, an offset generated in the pixel 310, such as kTC noise, is also amplified and output. Furthermore, the amplifier unit 440 also amplifies and outputs random noise generated in a pixel. Moreover, the output of the amplifier unit 440 also includes an offset of the amplifier unit 440 itself. The amplifier unit 440 supplies the amplified signal to the digital value generation circuit 400. The amplifier unit 440 is an example of an amplification unit described in the claims.

The digital value generation circuit 400 generates a digital value indicating the amount of light incident on the pixel 310 (the amount of charge stored by photons in a pixel) based on the output signal amplified by the amplifier unit 440. The digital value generation circuit 400 is provided to each vertical signal line 341. In other words, the imaging device 100 includes 128 digital value generation circuits 400 connected respectively to 128 vertical signal lines 341 wired to pixels (32 rows×128 columns) driven by the vertical drive circuit 110. The digital value generation circuit 400 removes almost all offset components generated in the pixel 310 and the amplifier unit 440 and then generates a digital value, but cannot remove random noise generated in the pixel and generates a digital value. The digital value generation circuit 400 supplies the generated digital value to a resistor 130 connected to the digital value generation circuit 400. The digital value generation circuit 400 is an example of a generation unit described in the claims.

The resistor 130 is provided to each digital value generation circuit 400, and temporarily holds the digital value supplied from the digital value generation circuit 400. The resistors 130 output their holding digital values in turn to the binary decision unit 220 in a period during which signals of pixels in the next row are being read (a read-out period).

The adjustment value holding unit 210 holds values (adjustment values) indicating threshold values required to make binary decisions for the digital values sequentially supplied from the resistors 130. Here, a description is given of the adjustment value. The threshold value indicated by the adjustment value is a value set as a value between the value of a digital value in a case where no photon is incident on a pixel, and the value of a digital value in a case where one photon is incident on the pixel. The difference between the digital value in the case of the non-entrance of a photon and the digital value in the case of the entrance of one photon changes depending on conversion efficiency into the digital value of the stored charge (the value indicating the magnitude of the converted digital value). In other words, as the conversion efficiency is increased by, for example, providing, to a pixel, an amplifier transistor with a large amplification factor, the difference between the digital value in the case of the non-entrance of a photon and the digital value in the case of the entrance of one photon is increased. The adjustment value holding unit 210 holds such an adjustment value for specifying a threshold value, for each pixel. The adjustment value is set in such a manner as that the value of a threshold value for a multi-level (multi-level gradation) digital value can be identified with a low gradation value. In other words, the adjustment value is set in such a manner as that the digital value of a threshold value can be identified with a lower number of bits than the number of bits required to indicate a digital value. The adjustment value is described with reference to FIG. 5. Therefore, its description is omitted here.

The adjustment value holding unit 210 is configured of a semiconductor recording apparatus, and is fabricated of a nonvolatile memory, for example, if the adjustment value is held in the manufacturing process of the imaging device 100 and is not changed during use. Moreover, if a threshold value is detected and held during the use of or before the start of the use of the imaging device 100, the adjustment value holding unit 210 is fabricated of a rewritable volatile memory such as an SRAM (Static Random Access Memory). For example, if a four-bit adjustment value is set for each of the pixels 310 of 128 rows×128 columns, the adjustment value holding unit 210 having a capacity of 64K bits is provided to the imaging device 100.

In terms of the adjustment value holding unit 210, an example where the adjustment value holding unit 210 holds pixel-specific adjustment values is described in the first embodiment of the present technology. If the same threshold value can be set since each of predetermined group units (for example, each column) has the same conversion efficiency, an adjustment value can also be set for each group unit (for example, each column). The adjustment value holding unit 210 is an example of a holding unit described in the claims.

The binary decision unit 220 makes binary decisions on the entrance or non-entrance of a photon into pixels that have output signals converted into digital signals sequentially supplied from the resistors 130, based on the digital signals. The binary decision unit 220 acquires, from the adjustment value holding unit 210, an adjustment value for a pixel that output a signal to have been converted into a digital value targeted for a binary decision. The binary decision unit 220 then uses a lookup table indicating the relationship between the value of the adjustment value and the gradation value of the digital value to convert the acquired adjustment value into a gradation value of a digital value. The binary decision unit 220 then decides the digital value targeted for a binary decision with the converted gradation value of the digital value as the threshold value. The binary decision unit 220 supplies the decision result (binary value) to the output circuit 150. The binary decision unit 220 is an example of a decision unit described in the claims.

The output circuit 150 outputs a signal generated by the imaging device 100 to an external circuit.

Next, an example of a circuit configuration of the pixel 310 is described with reference to FIG. 2.

[A Circuit Configuration Example of the Pixel]

Figure 2:
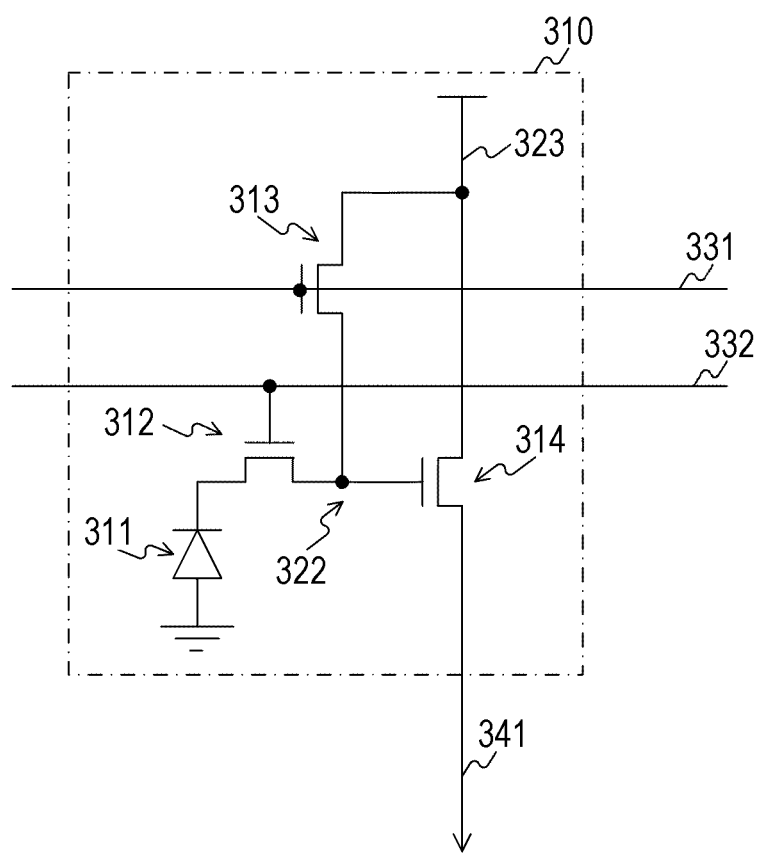
FIG. 2 is a schematic diagram illustrating an example of a circuit configuration of a pixel 310 of the first embodiment of the present technology.

FIG. 2 is a schematic diagram illustrating an example of a circuit configuration of the pixel 310 of the first embodiment of the present technology.

The pixel 310 converts an optical signal being incident light into an electrical signal by photoelectric conversion. The pixel 310 amplifies the converted electrical signal and outputs the electrical signal as a pixel signal. The pixel 310 amplifies the electrical signal with, for example, a FD amplifier having a floating diffusion layer (floating diffusion: FD: Floating-Diffusion).

In FIG. 2, it is assumed that the amplifier unit 440 is provided to each vertical signal line 341, and a description is given of a pixel including a source follower amplifier transistor.

The pixel 310 includes a photodiode 311, a transfer transistor 312, a reset transistor 313, and an amplifier transistor 314.

In the pixel 310, the photodiode 311 is grounded at its anode terminal, and is connected at its cathode terminal to a source terminal of the transfer transistor 312. Moreover, the transfer transistor 312 is connected at its gate terminal to the charge transfer line 332, and is connected at its drain terminal to a source terminal of the reset transistor 313 and a gate terminal of the amplifier transistor 314 via a floating diffusion (FD 322).

Moreover, the reset transistor 313 is connected at its gate terminal to the pixel reset line 331, and connected at its drain terminal to a power line 323 and a drain terminal of the amplifier transistor 314. Moreover, a source terminal of the amplifier transistor 314 is connected to the vertical signal line 341.

The photodiode 311 is a photoelectric conversion device that generates charge in accordance with the intensity of light. In the photodiode 311, an electron-hole pair is generated by a photon incident on the photodiode 311. Here, the generated electron is stored.

The transfer transistor 312 transfers the electron generated in the photodiode 311 to the FD 322 in accordance with a signal (transfer pulse) from the vertical drive circuit 110. For example, when a signal (pulse) is supplied from the charge transfer line 332 to the gate terminal of the transfer transistor 312, the transfer transistor 312 is brought into conduction and transfers the electron generated in the photodiode 311 to the FD 322.

The reset transistor 313 resets the potential of the FD 322 in accordance with a signal (reset pulse) supplied from the vertical drive circuit 110. The reset transistor 313 is brought into conduction when having been supplied with the reset pulse to its gate terminal via the pixel reset line 331. Current flows through the power line 323 from the FD 322. Consequently, the electrons stored in the floating diffusion (FD 322) are pulled to the power. The floating diffusion is then reset (hereinafter, the potential at this point in time is referred to as the reset potential). When the photodiode 311 is reset, the transfer transistor 312 and the reset transistor 313 are simultaneously brought into conduction. Consequently, the electrons stored in the photodiode 311 are pulled to the power, and the photodiode 311 is reset to a state where no photon has entered (dark state). The potential (power) flowing through the power line 323 is the power used for resetting and a source follower. For example, 3 V is supplied.

The amplifier transistor 314 amplifies the potential of the floating diffusion (the FD 322) and outputs a signal (output signal) in accordance with the amplified potential to the vertical signal line 341. The amplifier transistor 314 illustrated in FIG. 2 is a source follower amplifier transistor. The amplification factor approaches one. When the potential of the floating diffusion (the FD 322) has been reset (in a case of the reset potential), the amplifier transistor 314 outputs, to the vertical signal line 341, an output signal in accordance with the reset potential (hereinafter referred to as the reset signal). Moreover, when the electrons stored in the photodiode 311 have been transferred to the FD 322, the amplifier transistor 314 outputs, to the vertical signal line 341, an output signal in accordance with the amount of the transferred electrons (hereinafter referred to as the storage signal). If the vertical signal line 341 is shared among a plurality of pixels as in FIG. 1, a select transistor may be inserted, pixel by pixel, between the amplifier transistor 314 and the vertical signal line 341.

The basic circuit and operation mechanism of such a pixel as illustrated in FIG. 2 are similar to a normal pixel. Other various variations are conceivable. However, a pixel assumed in the present technology is designed to have significantly higher conversion efficiency than the conventional pixel. In order to achieve it, a pixel is designed to effectively reduce the parasitic capacitance of the gate terminal of an amplifier (the amplifier transistor 314) configuring a source follower (the parasitic capacitance of the FD 322) to the utmost minimum. The design can be realized by, for example, a method for devising layout, and a method for feeding the output of the source follower back to a circuit in a pixel (see, for example, Japanese Patent Application Laid-Open Nos. 5-63468 and 2011-119441).

Figure 3:
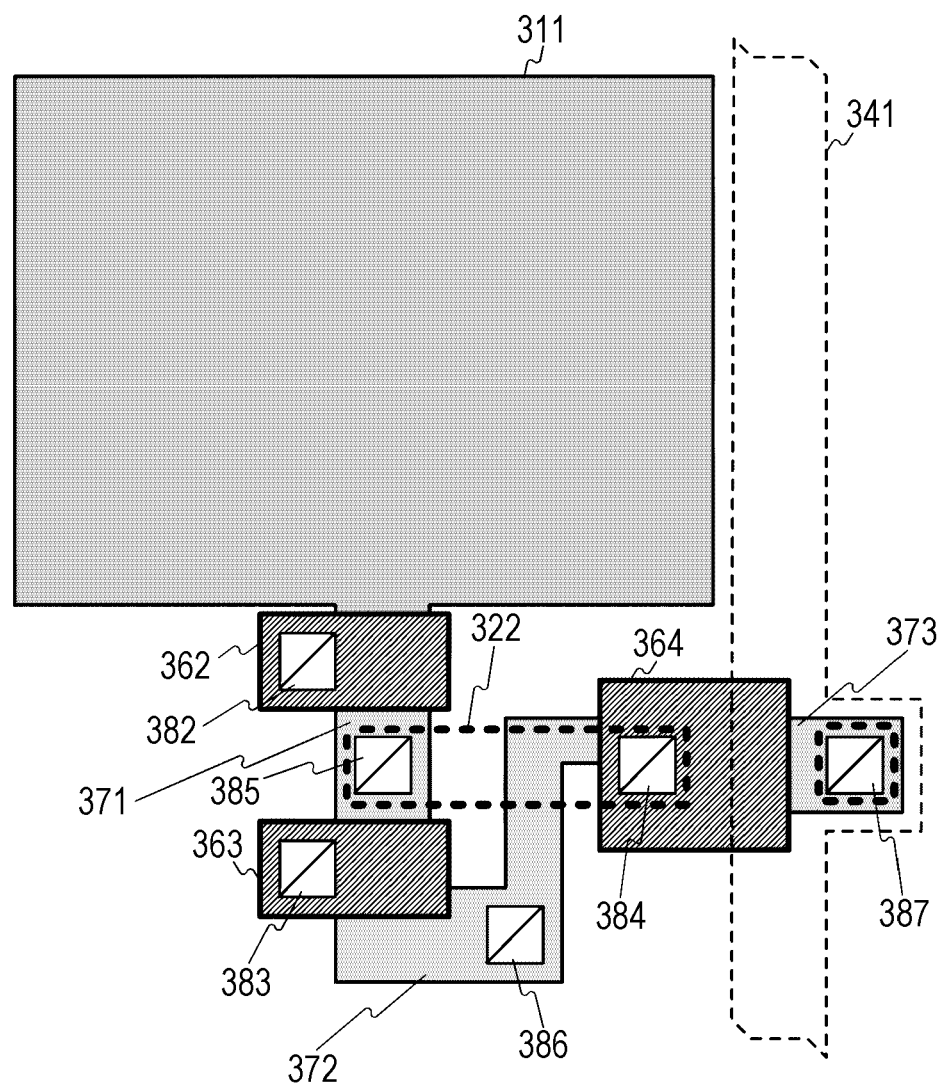
FIG. 3 is a diagram schematically illustrating an example of the layout of the pixel 310 of the first embodiment of the present technology.

Next, a description is given of an example of the layout of the pixel 310 designed to have a small parasitic capacitance of the gate terminal of the amplifier transistor 314, with reference to FIG. 3.

[A Flat Layout Example of the Pixel]

FIG. 3 is a diagram schematically illustrating an example of the layout of the pixel 310 of the first embodiment of the present technology.

Here, a description is given focusing on the parasitic capacitance of the gate terminal of the amplifier transistor 314, and the floating diffusion (the FD 322).

In the layout of the pixel 310 illustrated in FIG. 3, the photodiode 311, the FD 322, and the vertical signal line 341 are illustrated. Moreover, FIG. 3 illustrates the wiring of the gate terminal of the transfer transistor 312 (gate wiring 362), the wiring of the gate terminal of the reset transistor 313 (gate wiring 363), and the wiring of the gate terminal of the amplifier transistor 314 (gate wiring 364). The FD 322 is illustrated by the bold broken line. The vertical signal line 341 is illustrated by the narrow broken line. The gate wirings 362 to 364 are illustrated by the diagonally shaded rectangles.

Furthermore, FIG. 3 illustrates the drain terminal of the transfer transistor 312, the source terminal of the reset transistor 313, and an impurity diffusion layer (a diffusion layer 371) corresponding to wiring between the two terminals. Moreover, FIG. 3 illustrates the drain terminal of the reset transistor 313, the drain terminal of the amplifier transistor 314, and an impurity diffusion layer (a diffusion layer 372) corresponding to wiring between the two terminals. FIG. 3 illustrates an impurity diffusion layer (a diffusion layer 373) corresponding to the source terminal of the amplifier transistor 314. The diffusion layers 371 to 373 are illustrated by the small dot rectangles.

Furthermore, the layout illustrates a contact (a contact 382) for connecting the gate wiring 362 to the charge transfer line 332, and a contact (a contact 383) for connecting the gate wiring 363 to the pixel reset line 331. Moreover, the layout illustrates a contact (a contact 384) for connecting the gate wiring 364 to the FD 322, and a contact (a contact 385) for connecting the diffusion layer 371 to the FD 322. Furthermore, the layout illustrates a contact (a contact 386) for connecting the diffusion layer 372 to the power line 323, and a contact (a contact 387) for connecting the diffusion layer 373 to the vertical signal line 341.

Here, the layout of the pixel 310 is described focusing on the size of the FD 322. The layout of the pixel 310 is designed to minimize the parasitic capacitance of the FD 322. Hence, the layout of the pixel 310 is designed in such a manner as that the FD 322 being a wiring portion linking the diffusion layer 371 to the gate wiring 364, the diffusion layer 371, and the gate wiring 364 have minimum possible areas in terms of the manufacture. Moreover, in the pixel 310, the width of the drain terminal of the amplifier transistor 314 (in the vicinity of the gate wiring 364 of the diffusion layer 373) is narrowed.

The parasitic capacitance is reduced with such a design as illustrated in FIG. 3. Accordingly, even if the number of electrons stored in the FD 322 is small, it is possible to be configured in such a manner as that a sufficiently large output signal is output to the vertical signal line 341. The magnitude of the output signal is simply required to be sufficiently larger than the random noise of the amplifier transistor 314. When the output signal at the time when one photon is stored in the FD 322 becomes sufficiently larger than the random noise of the amplifier transistor 314, a signal from the pixel is quantized, and the number of stored photons of the pixel can be detected as a digital signal.

For example, if the random noise of the amplifier transistor 314 is approximately 50 pV to 100 pV and the conversion efficiency of the output signal is raised to approximately 600 pV/e−, the output signal is sufficiently larger than the random noise. Accordingly, one photon can be detected in theory.

For example, if a power supply voltage of approximately 3 V is supplied, such a pixel 310 as illustrated in FIG. 3 can also store charge of approximately 1000 e− in the photodiode 311. The storage signal (output signal) in this case is analog output having an operating range of approximately 0.6 V. Also in this case, the magnitude of a signal per electron is approximately 10 times larger than before. Hence, the influence of the random noise of the amplifier transistor 314 and the digital value generation circuit 400 is reduced to approximately one-tenth. In other words, the pixel 310 is suitable for image capture at low illuminance.

In this manner, the output signal of a pixel including a photodiode and an amplifier transistor can be treated as binary data and also as analog data with gradation if the conversion efficiency is sufficiently high. However, there is an issue that such a pixel has a low upper limit (dynamic range) of the amount of light detected for one image capture. In order to improve the dynamic range, it is effective to increase a read-out speed of a signal output by a pixel, increase the frame rate, and then collect a plurality of readout results. For example, when exposures and readouts are performed 1023 times to collect the results in a case where binary decisions are made on the entrance of a photon, a dynamic range per pixel is 10-bit gradation data. Moreover, also when the maximum number of electrons to be stored is 1000 e−, and an analog output is performed to decide the number of photons, if exposures and readouts are performed 16 times to collect the results, then the outcome is equal to the output of a pixel whose maximum number of electrons to be stored is 16,000 e−.

In FIG. 3, the description was given of the example of a pixel that can detect one photon by designing a pixel to effectively reduce the parasitic capacitance to the utmost minimum. However, the design is not limited to the example. In addition, one photon can be detected similarly by a pixel that amplifies, in the pixel, an electron obtained by photoelectric conversion. For example, a pixel is conceivable in which CCD multiplication/transfer elements are buried in a plurality of stages between a photodiode and a gate terminal of an amplifier transistor in the pixel (see, for example, Japanese Patent Application Laid-open No. 2008-35015). In the pixel, the photoelectrically converted electron is multiplied by approximately 10 times in the pixel. In this manner, one photon can be detected also by multiplying an electron in a pixel, and an imaging device having such a pixel can also be used as the imaging device 100.

Figure 4:
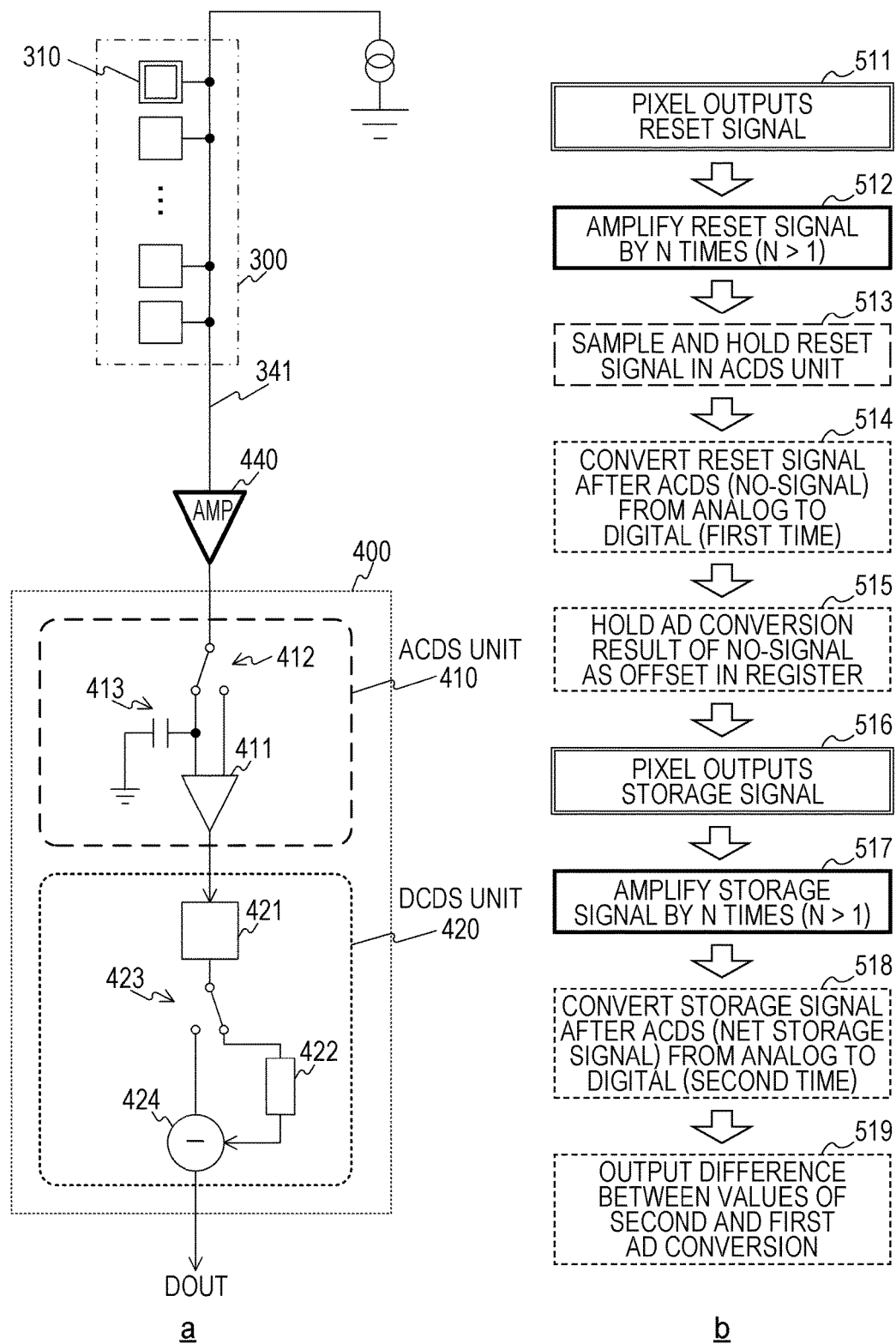
FIGS. 4a and 4b are conceptual diagrams illustrating an example of a functional configuration example of a digital value generation circuit 400 of the first embodiment of the present technology and an example of an operation example of the digital value generation circuit 400.

Next, functional configurations of the digital value generation circuit 400 are described with reference to FIGS. 4a and 4b.

[A Functional Configuration Example of the Digital Value Generation Circuit]

FIGS. 4a and 4b are conceptual diagrams illustrating an example of a functional configuration example of the digital value generation circuit 400 of the first embodiment of the present technology and an example of an operation example of the digital value generation circuit 400.

FIG. 4a illustrates the amplifier unit 440, the ACDS (Analog Correlated Double Sampling; analog correlated double sampling) unit 410, and a DCDS (Digital CDS; digital correlated double sampling) unit 420, as the functional configurations of the digital value generation circuit 400.

Moreover, FIG. 4a illustrates the vertical signal line 341 connected to the digital value generation circuit 400, part of the pixels 310 connected to the vertical signal line 341, the pixel array unit 300, and the amplifier unit 440 together with the functional configurations of the digital value generation circuit 400.

The ACDS unit 410 removes offsets by analog CDS, and includes a switch 412, a capacitor 413, and a comparator 411.

The switch 412 is a switch for connecting the vertical signal line 341 to an input terminal for inputting the reference voltage into the comparator 411, or an input terminal for inputting a signal targeted for comparison into the comparator 411. The switch 412 connects the vertical signal line 341 to the input terminal for inputting the reference voltage (the left terminal connected to the capacitor 413) if the reset signal of the pixel 310 is sampled and held. Moreover, the switch 412 connects the vertical signal line 341 to the input terminal for inputting a signal targeted for comparison (the right terminal with no capacitor) if the comparator 411 outputs the result of analog CDS.

The capacitor 413 is a holding capacitor to sample and hold the reset signal of the pixel 310.

The comparator 411 outputs the difference between a sampled and held signal and a signal targeted for comparison. In other words, the comparator 411 outputs the difference between a sampled and held reset signal and a signal supplied from the vertical signal line 341 (the storage signal or reset signal). In other words, the comparator 411 removes offsets generated in the pixel 310 such as kTC noise, offsets of the amplifier unit 440, and the like from the storage signal or reset signal.

The comparator 411 is fabricated of, for example, an operational amplifier of gain 1. The comparator 411 supplies a signal of the difference to the DCDS unit 420. Here, a signal of the difference between the reset signals is referred to as the no-signal, and a signal of the difference between the reset signal and the storage signal as the net storage signal.

The DCDS unit 420 removes offsets by digital CDS and includes an AD (Analog Digital) conversion unit 421, a resistor 422, a switch 423, and a subtractor 424.

The AD conversion unit 421 converts a signal supplied from the comparator 411 from analog to digital.

The switch 423 is a switch that switches a supply destination of an AD converted signal generated by the AD conversion unit 421. If the AD conversion unit 421 outputs the AD conversion result of the no-signal (a digital no-signal), the switch 423 supplies the signal to the resistor 422 and causes the resistor 422 to latch (hold) the signal. Consequently, the values of offsets of the comparator 411 and the AD conversion unit 421 are held in the resistor 422. Moreover, if the AD conversion unit 421 outputs the AD conversion result of the net storage signal (a digital net storage signal), the switch 423 supplies the signal to the subtractor 424.

The resistor 422 holds the AD conversion result of the no-signal. The resistor 422 supplies, to the subtractor 424, the holding AD conversion result of the no-signal (the digital no-signal).

The subtractor 424 subtracts the value of the digital no-signal from the value of the digital net storage signal. The subtractor 424 outputs the subtracted result (a net digital value).

Here, an advantage in providing the amplifier unit 440 is described from the point of the operation of each configuration of the digital value generation circuit 400. A signal output by the pixel 310 is amplified by N times by the amplifier unit 440 to enable resolution required when the AD conversion unit 421 performs AD conversion to drop to 1/N. Especially, the amplifier unit 440 is provided between the pixel 310 and the ACDS unit 410. Accordingly, the signal of the pixel 310 is amplified by N times before entering the ACDS unit 410 while offsets generated in the pixel 310 and offsets of the amplifier unit 440 can be removed. In other words, the AD conversion unit 421 converts a signal from which the offsets of the pixel 310 and the offsets of the amplifier unit 440 have been removed, from analog to digital, to minimize offset components upon AD conversion.

In other words, one-N-th of the resolution of AD conversion of another imaging device without the amplifier unit 440 is sufficient, and the amount of offset components upon AD conversion is the same. Accordingly, the time required for AD conversion can be shortened. Especially, upon AD conversion of the no-signal, the no-signal where offset components have been minimized is converted from analog to digital at one-N-th resolution. Accordingly, the time required is significantly shortened. The offset components configuring the no-signal here are an offset component generated in the ACDS unit 410 and an offset component generated in the DCDS unit 420.

Moreover, in a case of the detection of faint light, such as the detection of one photon, using the imaging device 100, most of the storage signal from the pixel 310 becomes a no-signal (offset). Moreover, in a case of the detection of one photon, the amount to be counted for the output signal of the pixel 310 (a potential difference) is remarkably reduced. The AD conversion time for the output signal of the pixel 310 is remarkably short. In other words, the time required for AD conversion can be significantly shortened.

When an amplifier unit that amplifies a signal output by a pixel is provided in a normal imaging device that generates multi-level gradation data, variations in the gain of the amplifier unit 440 are directly reflected as it is on the final output, which results in a vertical stripe according to each column (column). However, if a binary decision is made on the entrance or non-entrance of one photon into a pixel with faint light as a detection target, a threshold value (a decision threshold value) for discriminating between the number of photons, "0", and the number of photons, "1", is set appropriately. Accordingly, the influence of variations in gain can be filtered and completely eliminated. The setting of the decision threshold value is described with reference to FIGS. 5a and 5b and 7a and 7b. Therefore, its detailed description is omitted here.

The digital value generation circuit 400 illustrated in FIGS. 4a and 4b may perform CDS with the auto-zero operation by integrating the comparator 411 and the AD conversion unit 421. An example of a circuit configuration of such a digital value generation circuit 400 is described with reference to FIG. 12.

Here, the operation of the digital value generation circuit 400 illustrated in FIG. 4a is described with reference to FIG. 4b.

FIG. 4b illustrates a flowchart illustrating an example of an operation example of the digital value generation circuit 400. The box of each procedure of the flowchart illustrated in FIG. 4b corresponds to the box surrounding each configuration illustrated in FIG. 4a. In other words, the procedures illustrated by the double boxes indicate the procedures of the pixel 310. The procedure illustrated by the box of long broken line indicates the procedure of the ACDS unit 410. The procedures illustrated by the boxes of the short broken lines indicate the procedures of the DCDS unit 420. The procedures illustrated by the bold line boxes indicate the procedures of the amplifier unit 440. For convenience of description, the illustration of the ACDS process by the ACDS unit 410 is omitted. The ACDS process is described together with the procedure for the DCDS unit 420's AD conversion.

Firstly, in a pixel (the pixel 310) in a selected row, the potential of the gate terminal of the amplifier transistor 314 (the potential of the FD 322) is reset, and the reset signal is output to the vertical signal line 341 (Step 511).

Next, the reset signal output from the pixel 310 is amplified by N times (N>1) by the amplifier unit 440 (Step 512). The amplified reset signal also includes kTC noise being the offset component of the pixel and the offset components of the amplifier unit 440. The noises are also amplified and output. Moreover, the amplified reset signal also includes random noise generated in the pixel. The random noise is also amplified and output.

The reset signal amplified by the amplifier unit 440 is then sampled and held by the capacitor 413 of the ACDS unit 410 (Step 513).

A signal (no-signal) of the difference between the reset signal amplified by the amplifier unit 440 and the sampled and held reset signal is converted from analog to digital by the AD conversion unit 421 of the DCDS unit 420 (Step 514). The no-signal converted from analog to digital includes noises generated by the comparator 411 and the AD conversion unit 421, and is a digitally detected value for cancelling (offsetting) these noises. The AD conversion result of the no-signal is held as an offset value in the resistor 422 (Step 515).

Next, in the pixel 310, electrons stored in the photodiode 311 are transferred to the FD 322. The storage signal is output from the pixel 310 (Step 516). The storage signal output from the pixel 310 is subsequently amplified by N times (N>1) by the amplifier unit 440 (Step 517). A signal (the net storage signal) of the difference between the storage signal amplified by the amplifier unit 440 and the sampled and held reset signal is converted from analog to digital by the AD conversion unit 421 of the DCDS unit 420 (Step 518). With the signal of the difference from the sampled and held reset signal, the offset components of the pixel and the offset components of the amplifier unit 440 are cancelled. The AD conversion result of the signal of the difference includes noises generated by the comparator 411 and the AD conversion unit 421. Moreover, the AD conversion result of the signal of the difference also includes random noise of the pixel.

The subtractor 424 then outputs a value obtained by subtracting the value of the AD conversion result of the no-signal held in the resistor 422 (first time) from the value of the AD conversion result of the net storage signal (second time) (Step 519). Consequently, the noises (offset components) caused by the comparator 411 and the AD conversion unit 421 are cancelled. A digital value (the net digital value) indicating the magnitude of the storage signal output by the pixel 310 and the magnitude of the random noise of the pixel is output.

In this manner, the random noise generated in the pixel is not cancelled by ACDS and DCDS and is included in the net digital value. Especially, the random noise is amplified by the amplifier unit 440. Accordingly, variations of the digital values due to random noise are increased.

Here, the description was given focusing only on the random noise of the pixel as random noise included in a digital value. However, each of the amplifier unit 440, the ACDS unit 410, and the DCDS unit 420 also generates random noise. These random noises are also included in the net digital value. Especially, the random noise of the amplifier unit 440 is caused to be amplified by N times. The random noise of the amplifier unit 440 can be reduced by configuring the amplifier unit 440 with a transistor having a sufficiently large area. These random noises can be reduced to a certain degree by multiple sampling and band limitation. However, they cannot be completely removed as in the offset components.

The net digital value generated by the digital value generation circuit 400 is supplied to the binary decision unit 220. The binary decision unit 220 then sets a threshold value of a binary decision for the pixel that output the storage signal to have changed into the supplied net digital value, from a pixel-specific adjustment value held by the adjustment value holding unit 210. The set threshold value and the net digital value are subsequently compared. The binary decision unit 220 then makes a binary decision on the entrance or non-entrance of one photon.

Next, a pixel-specific adjustment value held by the adjustment value holding unit 210 is described with reference to FIGS. 5a and 5b.

[An Example of a Pixel-Specific Adjustment Value Held by the Adjustment Value Holding Unit]

FIGS. 5a and 5b are diagrams for explaining adjustment values held by the adjustment value holding unit 210 of the first embodiment of the present technology.

FIG. 5a illustrates a table schematically illustrating pixel-specific adjustment values held by the adjustment value holding unit 210. Moreover, FIG. 5b illustrates a table schematically illustrating the relationship between the decision threshold value (the gradation value of a digital value) of a binary decision in the binary decision unit 220, and the adjustment value.

In FIG. 5a, the pixels of 128 rows×128 columns in the pixel array unit 300 are illustrated identifying the pixels by row numbers and column numbers. Moreover, in FIGS. 5a and 5b, the adjustment value is assumed to be a 4-bit (0 to 15) value.

As illustrated in the table of FIG. 5a, pixel-specific adjustment values are held in the adjustment value holding unit 210. The adjustment value is set for each pixel in, for example, the manufacturing process of the imaging device 100, and held in the adjustment value holding unit 210. The setting of the adjustment value is described with reference to FIG. 9a to FIG. 11. Accordingly, its description is omitted here.

In terms of the adjustment values illustrated in FIG. 5a, when the binary decision unit 220 makes a binary decision, an adjustment value of a pixel targeted for the binary decision is acquired. In the binary decision unit 220, the adjustment value is converted into a decision threshold value (gradation value) associated with a value (0 to 15) of the adjustment value.

In other words, as illustrated in the table of FIG. 5b, the binary decision unit 220 holds information (the lookup table) indicating the association of the value of the adjustment value and the decision threshold value (gradation value). The adjustment value is converted into a decision threshold value based on the information. In other words, a 16-gradation decision threshold value can be set with a 0-bit adjustment value.

If the adjustment value is converted into a decision threshold value, the binary decision unit 220 makes a binary decision based on the converted threshold value.

Consequently, an appropriate threshold value can be set, pixel by pixel, against a variation in the output value of each pixel to make a binary decision. For example, if gain varies according to each amplifier unit 440 illustrated in FIG. 1, and gain also varies according to each amplifier transistor 314 of the pixels illustrated in FIG. 2, it is assumed that gain applied to a signal output by a pixel is largely different according to each pixel. Also in such a case, an appropriate threshold value is set, pixel by pixel, to enable an accurate binary decision.

In FIGS. 5a and 5b, the example where an adjustment value is set, pixel by pixel was described. However, the setting of an adjustment value for each variation unit is also conceivable. For example, if the amplifier unit 440 is provided to each column (each vertical signal line 341), when the gains of the amplifier units 440 vary, but the gains of amplifier transistors 314 of the pixels do not vary, it is also possible to set an adjustment value for each column.

Next, the relationship between the number of photons incident on each pixel and the detection result (the binary decision result) is described with reference to FIG. 6.

[An Example of the Relationship Between the Number of Photons Incident on Each Pixel and the Detection Result]

Figure 6:
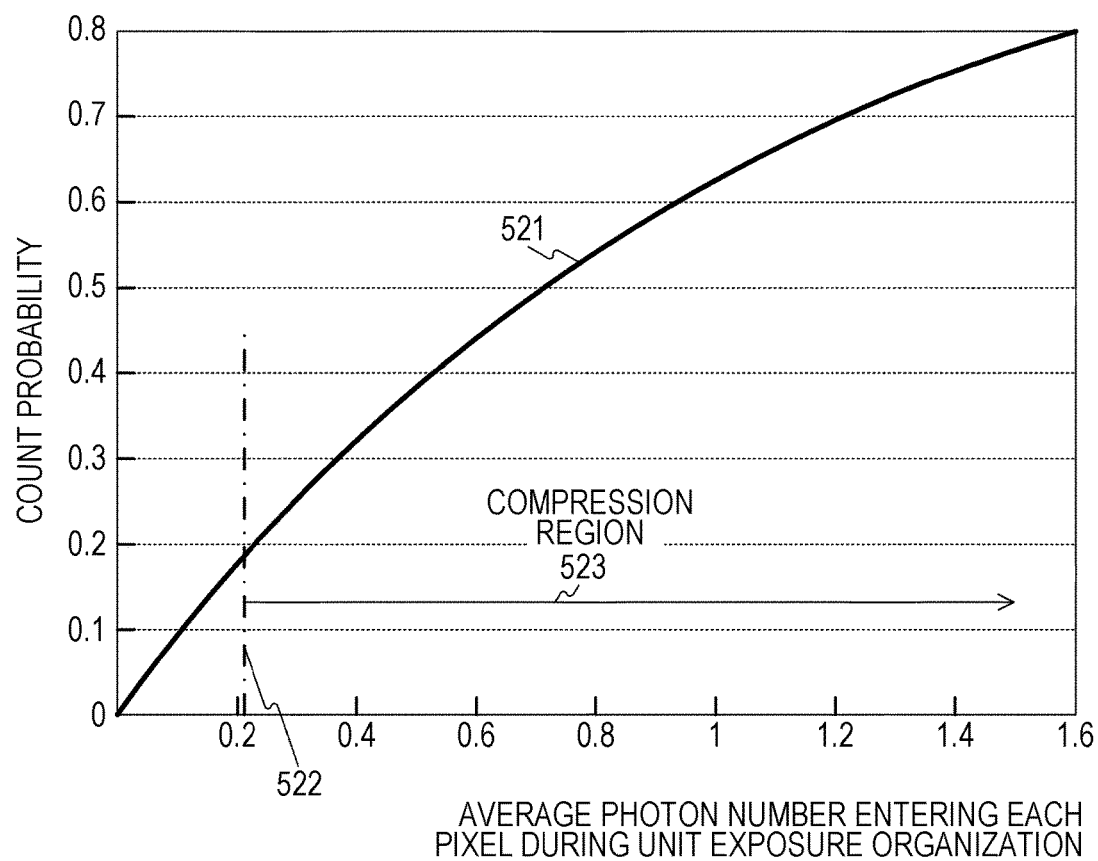
FIG. 6 is a graph illustrating the relationship between the average number of photons incident on each pixel during a unit exposure period and the count probability in the first embodiment of the present technology.

FIG. 6 is a graph illustrating the relationship between the average number of photons incident on each pixel during a unit exposure period and the count probability in the first embodiment of the present technology.

A description is given assuming that photons are uniformly and randomly incident on each pixel of the imaging device. Photons are assumed to be uniformly and randomly incident in terms of time.

Under such conditions, the relationship between the average number of photons (average photon number) incident on each pixel during the unit exposure period and the probability that incident photons are counted (decided by the binary decision unit 220 to be "1") (the count probability) is pursuant to the Poisson distribution (Poisson distribution). The relationship between the average photon number and the count probability is pursuant to the Poisson distribution so that it becomes the relationship expressed by the following Equation 1.

[Math. 1]

$$P(k) = \frac{\lambda^k e^{-\lambda}}{k!} \qquad \text{Equation 1}$$

where P(k) is the probability that the entrance of a photon occurs k times (the entrance of k photons) in a unit pixel during the unit exposure period, λ is the average number of photons (the average photon number) incident on the unit pixels during the unit exposure period, and e is the base of a natural logarithm (≈2.718).

In other words, if the number of photons incident on each pixel during the unit exposure period is the average photon number Δ, the probability P(k) of the above-mentioned Equation 1 indicates the probability that the number of incident photons is the number of photons, k.

Here, a description is given of the relationship between the average photon number and the count probability, assuming that the average of the number of photons (the average photon number Δ) incident on each pixel of the imaging device during the unit exposure period is "0.21". In this case, the number of photons k and the probability P(k) have the following relationship based on the above-mentioned Equation 1.

The probability that the number of photons incident on the unit pixel is zero (k=0): 0.8105

The probability that the number of photons incident on the unit pixel is one (k=1): 0.1702

The probability that the number of photons incident on the unit pixel is two (k=2): 0.0179

The probability that the number of photons incident on the unit pixel is three (k=3): 0.0013

. . . (the values of the subsequent probabilities are very small (0.00007 or less) so that the description is omitted).

In this manner, the value of the probability of an overlap of a photon incident on the unit pixel is reduced with increasing number of overlapping photons.

Next, a description is given of a signal generated by the imaging device when photons are incident with such probabilities.

A case where the digital value output by the binary decision unit 220 is "0" is a case where the number of photons incident on the unit pixel is zero. In other words, the probability that the digital value is "0" is "0.8105", the probability of the case where the number of photons incident on the unit pixel is zero.

On the other hand, a case where the digital value output by the binary decision unit 220 is "1" includes all the cases where the number of photons incident on the unit pixel is one or greater. In other words, the probability (count probability) that the digital value is "1" is "0.1894", a value of the sum total of the probabilities of the cases where the number of photons incident on the unit pixel is one or greater.

Since the average photon number λ is "0.21", the count probability "0.1894" indicates that approximately 10% of incident photons is not counted (count loss). The count loss is caused by that the entrance of two or more photons into the unit pixel during the unit exposure period is counted as "1". Therefore, as the average photon number λ is increased, the count loss is also increased.

Up to this point the description has been given assuming that the average photon number λ is "0.21". However, such a relationship between the average photon number λ and the count probability is unique if photons are uniformly and randomly incident in terms of space and time. In other words, when the vertical axis is an axis indicating the count probability and the horizontal axis is the average photon number of photons incident on each pixel during the unit exposure period, the relationship between the count probability and the average photon number is the relationship indicated by the solid line (a line 521) of the table of FIG. 6.

In the table of FIG. 6, the position of the average photon number indicated by the dot and dash line (a dot and dash line 522) indicates a position where the count of approximately 10% of incident photons is lost (a 10% detection loss position). When the count loss of approximately 10% is tolerated, linearity is assumed to be guaranteed if the average photon number is "0.21" or less. When viewed from the side of the digital output value generated by the imaging device, in other words, if the count probability of the digital value generated by the imaging device is "0.1894" or less, it is judged that image capture was performed with the illuminance and exposure conditions that can guarantee linearity. On the other hand, if the count probability exceeds "0.1894" (in an area indicated by a compression region 523 of FIG. 6), there are many count losses and it is judged that linearity cannot be guaranteed.

The count probability and the average photon number have the relationship illustrated in the table of FIG. 6. Accordingly, data indicating such a relationship as illustrated in the table (for example, a function or table of the Poisson distribution or approximated to the Poisson distribution) is held to enable the correction of a count value. In terms of the correction, firstly, a count probability (the ratio of pixels having a value of "1" to all the pixels) is calculated based on digital values generated by the imaging device. The average photon number is calculated from the count probability and the data indicating the relationship illustrated in the table of FIG. 6. The number of photons incident on the imaging device is calculated from the calculated average photon number. When the correction is made, it becomes possible to widen a detection dynamic range by approximately one digit as compared to a case of use within the range that can guarantee linearity (a case of no correction).

A pixel-specific adjustment value held in the adjustment value holding unit 210 is used to make a binary decision in the imaging device 100. Accordingly, an apparatus including the imaging device 100 can count photons accurately, and can judge linearity and correct a count value accurately.

Next, the effect of making a binary decision based on a pixel-specific adjustment value is described with reference to FIGS. 7a and 7b.

Effect Examples

FIGS. 7a and 7b are diagrams schematically illustrating the effect of making a binary decision using a pixel-specific adjustment value held by the adjustment value holding unit 210 of the first embodiment of the present technology.

FIG. 7a illustrates an example that assumes that a binary decision is made with one threshold value for all the pixels in the imaging device where gain varies according to each pixel (an example where a single threshold value is set for all the pixels).

FIG. 7a illustrates two graphs respectively illustrating the frequency distributions of output signals of two pixels (a pixel A and a pixel B) having different gains. In the two graphs, when the vertical axis is an axis indicating frequency, and the horizontal axis is an axis indicating the amount of signal (the gradation value of the digital value), the frequency distributions are illustrated of a signal generated in a state where there is no charge stored (a no-storage signal) and a signal generated in a state where one photon has entered (a one-photon signal). The frequency distributions are illustrated assuming that the pixel A is smaller in the value of gain (smaller in amplification factor) than the pixel B.

Moreover, a peak position for the no-storage signal of the pixel A is illustrated by a position G1, and a peak position for the one-photon signal of the pixel A by a position G2. Moreover, a peak position for the no-storage signal of the pixel B is illustrated by a position G3, and a peak position for the one-photon signal of the pixel B by a position G4.

In FIGS. 7a and 7b, for convenience of description, the peak position (the position G1) for the no-storage signal of the pixel A and the peak position (the position G3) for the no-storage signal of the pixel B are assumed to have the same amount of signal (for example, a gradation value of "0").

As illustrated in FIG. 7a, the pixel A is smaller in the value of gain than the pixel B. Accordingly, the distance between the peak position for the no-storage signal and the peak position for the one-photon signal is shorter in the pixel A than in the pixel B. Moreover, variations in the values due to random noise (a spread in the signal amount (gradation value) direction of the graph) are smaller in the pixel A having smaller gain than in the pixel B. Also in a case of the no-storage signal, as illustrated in FIG. 7a, the values vary due to random noise. Accordingly, a threshold value needs to be set to a higher value than the varied values, otherwise an erroneous decision is made.

In terms of the range of the amount of signal where a threshold value that does not cause an erroneous decision in a binary decision can be set, an area (an area P1) of the pixel A is narrower than an area (an area P2) of the pixel B. If gain increases by N times, the distance between the peak positions for the no-storage signal and the one-photon signal, variations in the values due to random noise, and the range where a threshold value that does not cause an erroneous decision can be set also increase by N times.

In this case, if a common threshold value to the pixels A and B is set, it is set from an area (an area P3) of the signal amount (gradation value) overlapping between the areas P1 and P2. FIG. 7a illustrates an example of the common threshold value as a threshold value H1.

As illustrated in FIG. 7a, if gain varies, it becomes difficult to set a common threshold value. In FIG. 7a, the description was given assuming that there is the area (the area P3) that allows binary decisions with no erroneous decisions in both of the two pixels. However, if gain varies very largely, it is also conceivable that the area (the margin of the setting of a threshold value) does not exist. Especially, as the number of pixels having variations in gain increases, the setting of a common threshold value becomes more difficult.

FIG. 7b illustrates an example of the imaging device 100 of the first embodiment of the present technology, the imaging device 100 making a binary decision using a pixel-specific adjustment value held by the adjustment value holding unit 210 (an example of setting a threshold value for each pixel using an adjustment value (the imaging device 100)).

The frequency distributions of the output signals of two pixels (the pixels A and B) having different gains illustrated in FIG. 7b are similar to those illustrated in FIG. 7a. Therefore, their details descriptions are omitted here. FIG. 7b illustrates values of the adjustment value, a threshold value (a threshold value H11) of the amount of signal corresponding to an adjustment value with a value of "5" set for the pixel A, and a threshold value (a threshold value H12) of the amount of signal corresponding to an adjustment value with a value of "7" set for the pixel B, in addition to the frequency distributions of the pixels A and B.

As illustrated in FIG. 7b, the adjustment value holding unit 210 is caused to hold pixel-specific adjustment values. Accordingly, a threshold value can be set for each pixel. Consequently, a binary decision can be made accurately.

[An Operation Example of the Binary Decision Unit]

Next, the operation of the binary decision unit 220 of the imaging device 100 in the first embodiment of the present technology is described with reference to the drawings.

Figure 8:
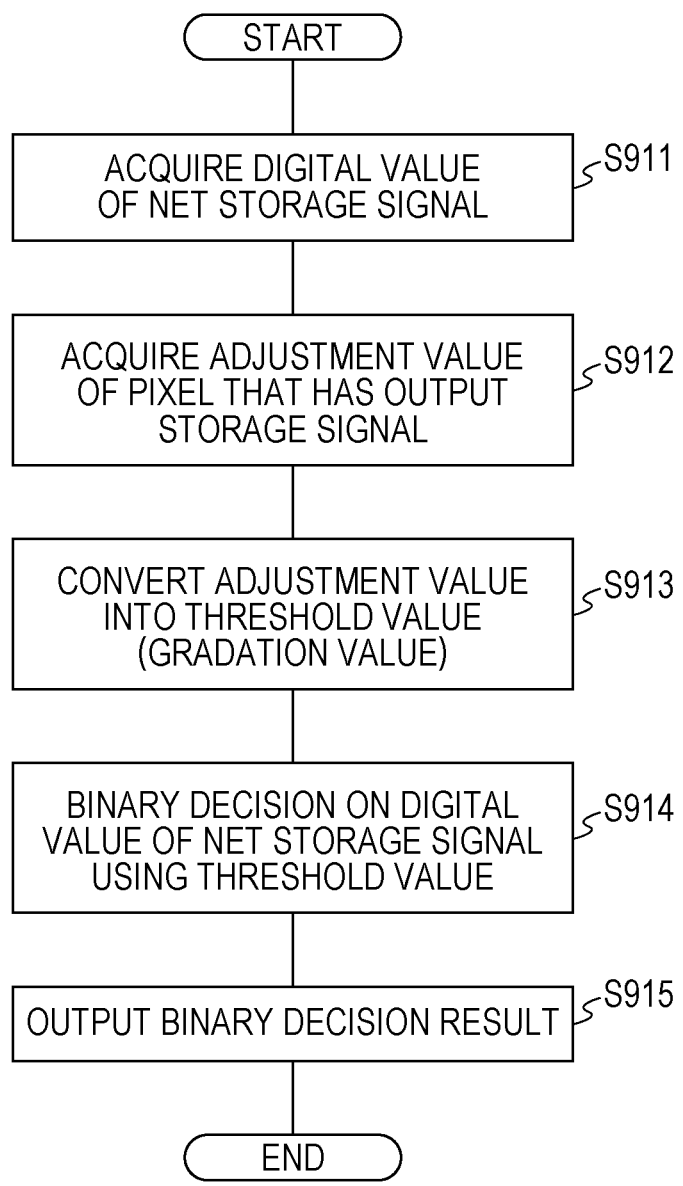
FIG. 8 is a flowchart illustrating an example of a procedure for a binary decision process by a binary decision unit 220 in the first embodiment of the present technology.

FIG. 8 is a flowchart illustrating an example of a procedure for a binary decision process by the binary decision unit 220 in the first embodiment of the present technology.

In FIG. 8, a description is given of a procedure for a process on one digital value supplied to the binary decision unit 220. In other words, for example, if signals are read from 128 pixels, the processing procedure illustrated in FIG. 8 is performed 128 times.

Firstly, the binary decision unit 220 acquires the digital value of a net storage signal read from the pixel 310 and digitized by the digital value generation circuit 400 (Step S911). A procedure of the digital value generation circuit 400 for generating the digital value of the net storage signal acquired by Step S911 is an example of a generation procedure described in the claims, and corresponds to Steps 511 to 519 in FIG. 4b. The binary decision unit 220 acquires, from the adjustment value holding unit 210, an adjustment value of the pixel that output the storage signal converted into the digital value (Step S912).

Next, the acquired adjustment value is converted into a decision threshold value (gradation value) (Step S913). The binary decision unit 220 makes a binary decision for the digital value of the net storage signal using the converted decision threshold value (Step S914). The binary decision result (the binary value indicating the entrance or non-entrance of light) is subsequently output (Step S915), and the procedure for the binary decision process ends. Step S914 is an example of a decision procedure described in the claims.

Up to this point the description has been given of a binary decision to be made by the binary decision unit 220 in the imaging device 100 using an adjustment value. In terms of the adjustment value, its value needs to be calculated, pixel by pixel, and held in the adjustment value holding unit 210 before photons are counted using the imaging device 100.

Next, the calculation of adjustment values is described with reference to FIG. 9a to FIG. 11.

[An Example of the Calculation of Pixel-Specific Adjustment Values]

FIGS. 9a and 9b are functional configuration diagrams for explaining an example of a method for calculating adjustment values when causing the adjustment value holding unit 210 of the imaging device 100 to hold the adjustment values, in the first embodiment of the present technology.

FIG. 9a schematically illustrates functional configurations upon calibration for calculating pixel-specific adjustment values and causing the adjustment value holding unit 210 to hold the adjustment values (upon the setting of adjustment values). FIG. 9b schematically illustrates functional configurations upon the use of the imaging device 100 for photon counting after the adjustment values are held (after the end of the setting of adjustment values). A description is given in FIG. 9a of an example where adjustment values are calculated in the manufacturing process of the imaging device 100 (or the manufacturing process of an apparatus on which the imaging device 100 is mounted) and written into the adjustment value holding unit 210 configured of a nonvolatile memory.

FIG. 9a illustrates the imaging device 100 targeted for the calculation of adjustment values and an apparatus (an adjustment apparatus 550) for calculating adjustment values. Reference numerals are assigned only to configurations used in the description and illustrated as the functional configurations of the imaging device 100. The functional configurations of the imaging device 100 are similar to those illustrated in FIG. 1. Therefore, their descriptions are omitted here.

The adjustment apparatus 550 calculates pixel-specific adjustment values and checks various kinds of performance of the imaging device 100. FIG. 9a illustrates the adjustment value calculation unit 551, as the functional configuration for calculating an adjustment value of the adjustment apparatus 550, in the adjustment apparatus 550. The adjustment apparatus 550 is an example of a threshold value calculation apparatus of the claims.

Here, the calculation of an adjustment value is described. For example, the adjustment apparatus 550 causes the imaging device 100 to generate no-storage signals a predetermined number of times, and output the digital values of the generated no-storage signals to the adjustment value calculation unit 551. In the imaging device 100, the function of the binary decision unit 220 (see FIGS. 1 and 9b) is turned off to output the digital values of the no-storage signals to the outside of the imaging device 100. In other words, the imaging device 100 outputs the digital values of the no-storage signals to the output circuit 150. In the imaging device 100 illustrated in FIG. 9a, the configurations are illustrated without illustrating the binary decision unit 220 whose function is turned off.

The adjustment value calculation unit 551 of the adjustment apparatus 550 calculates an adjustment value for each pixel based on the supplied digital values of the no-storage signals. The calculation method is described with reference to FIGS. 10a and 10b. Therefore, its detailed description is omitted here. The adjustment value calculation unit 551 is an example of an acquisition unit and a calculation unit of the threshold value calculation apparatus described in the claims.

FIG. 9b illustrates the imaging device 100 in a state where the adjustment values are held in the adjustment value holding unit 210 to be used for photon counting. The imaging device 100 in this state is similar to the imaging device 100 illustrated in FIG. 1. Therefore, its detailed description is omitted here.

As illustrated in FIG. 9b, when the setting of adjustment values ends, the function of the binary decision unit 220 is turned on. When the imaging device 100 operates, a pixel-specific adjustment value held in the adjustment value holding unit 210 is used to make a binary decision.

In FIGS. 9a and 9b, the example of performing calibration of causing adjustment values to be held in the manufacturing process of the imaging device 100 was described. However, various patterns are conceivable for the timing when the calibration is performed. For example, a case where the adjustment value calculation unit 551 is provided in an imaging apparatus including an imaging device, and the calibration is performed upon power-up of the imaging apparatus, and a case where the calibration is performed immediately before every image capture are also conceivable. If the calibration is performed upon power-up or immediately before image capture, it may be configured to perform the work of for example, measuring dark current together, detecting a faulty pixel at the moment when writing an adjustment value for a decision threshold value into a memory, and masking the faulty pixel.

Next, the calculation of an adjustment value by the adjustment value calculation unit 551 is described with reference to FIGS. 10a and 10b.

[An Example of the Calculation of Adjustment Values]

FIGS. 10a and 10b are diagrams schematically illustrating the calculation of adjustment values by the adjustment value calculation unit 551 in the first embodiment of the present technology.

In FIGS. 10a and 10b, a description is given assuming an example where adjustment values are calculated for the pixels A and B illustrated in FIGS. 7a and 7b. FIG. 10a illustrates a diagram for explaining the calculation of an adjustment value of the pixel A. FIG. 10b illustrates a diagram for explaining the calculation of an adjustment value of the pixel B.

The frequencies of the outputs of the pixels illustrated in FIGS. 10a and 10b are similar to those illustrated in FIGS. 7a and 7b. However, the curves indicating the frequency of the no-storage signal are exaggerated and illustrated by the bold solid lines (a frequency distribution curve 561 of FIG. 10a and a frequency distribution curve 565 of FIG. 10b). Moreover, the curves indicating the frequency of the one-photon signal are illustrated by the narrow broken lines (a frequency distribution curve 562 of FIG. 10a and a frequency distribution curve 566 of FIG. 10b).

FIGS. 10a and 10b illustrate the positions (a position G21 and a position G22) of average values calculated respectively from the frequencies of the no-storage signals of the pixels A and B, and the double-headed arrows indicating the magnitudes of the values of standard deviations ($\sigma$) calculated respectively from the frequencies of their respective no-storage signals. Moreover, FIGS. 10a and 10b illustrate the double-headed arrows indicating values (K1·$\sigma$) obtained by multiplying the standard deviations of the pixels A and B by a constant (K1) and the dot and dash lines (a threshold value T21 and a threshold value T22) indicating the calculated threshold values. Moreover, FIGS. 10a and 10b illustrate the axis indicating the adjustment value, and values ("5" for the pixel A and "7" for the pixel B) of adjustment values to be converted into gradation values closest to the values (gradation values) of the calculated threshold values, the values of the adjustment values being covered by the dotted rectangles of the broken lines.

Here, the calculation of adjustment values is described. When calculating adjustment values, the imaging device 100 generates no-storage signals a plurality of times (for example, 64 times for each pixel), and supplies the generated no-storage signals to the adjustment value calculation unit 551. Consequently, the adjustment value calculation unit 551 can detect, for each pixel, such distribution frequencies of the no-storage signal as indicated by the frequency distribution curve 561 of FIG. 10a and the frequency distribution curve 565 of FIG. 10b.

When adjustment values are calculated, it is difficult to generate a signal (a one-photon signal) generated in a state where one photon has entered. Accordingly, a signal in a state where there is light, such as a one-photon signal, is not generated. In FIGS. 10a and 10b, the frequency distribution curves (the frequency distribution curve 561 and the frequency distribution curve 565) of the no-storage signals generated upon the calculation of adjustment values are illustrated by the bold solid lines. The frequency distribution curves (the frequency distribution curves 562 and 566) of the one-photon signals illustrated for the purpose of description, which is not generated upon the calculation of adjustment values, are illustrated by the narrow broken lines.

The no-storage signal is generated in a state, for example, where the reset transistor 313 (see FIG. 2) is brought into conduction, the potential of the FD 322 is fixed to the reset potential, and image capture is simulatively achieved with no charge stored. The no-storage signal can be generated also by performing an image capture operation in a state of no light (a dark state) in an exposure time that is sufficiently short to avoid the occurrence of dark current (noise generated in the photodiode) equal to one electron.

The adjustment value calculation unit 551 then generates a frequency distribution for each pixel based on the no-storage signals generated the plurality of times, and calculates an average value (Av) and standard deviation (σ) of the amounts of signal (gradations) from the frequency distribution. Next, the adjustment value calculation unit 551 uses, for example, the following Equation 2 to calculate a threshold value (Vth) from the average value Av and the standard deviation σ.

$$Vth = Av + K1 \cdot \sigma \quad \text{Equation 2}$$

where K1 is a constant.

The constant K1 is set in such a manner as that the threshold value Vth calculated by Equation 2 is at a position (the amount of signal (gradation)) around the midpoint between the position (the position G21, the position G22) of the average (peak) for the no-storage signal and the position of the average (peak) for the one-photon signal.

Here, the above-mentioned Equation 2 is described. In the imaging device 100, the value of gain is different according to the pixel. Accordingly, the distance between the peak position for the no-storage signal and the peak position for the one-photon signal (the distance between the peaks) is different according to the pixel in response to the gain. Moreover, the degree of variations in the values of the no-storage signals is also different according to the pixel in response to the gain. The distance between the peaks and the degree of variations are also increased by N times when the gain is increased by N times.

Hence, the adjustment value calculation unit 551 calculates the standard deviation σ of the values of the no-storage signals as the value indicating the degree of variations in the values of the no-storage signals. The adjustment value calculation unit 551 then calculates a threshold value likening, to the gain, the standard deviation σ that increases/decreases in response to the gain. The adjustment value calculation unit 551 multiplies the standard deviation σ by the constant K1 to calculate the position of the threshold value from the peak position (the average value Av) for the no-storage signal. If a value obtained by multiplying the standard deviation σ by the constant K1 is doubled, it becomes a value close to the distance between the peak position for the no-storage signal and the peak position for the one-photon signal.

The constant K1 is a common value predetermined for each type of product (each type of circuit of an imaging device). For example, a frequency distribution upon the entrance of one photon is actually detected using a single photon generation apparatus. The constant K1 is calculated which allows the calculation of an appropriate threshold value in any gain (any pixel). The adjustment value calculation unit 551 is then caused to hold the calculated constant K1. Upon the calculation of an adjustment value, the constant K1 corresponding to an imaging device targeted for calculation is used to calculate a threshold value.

The average value Av becomes substantially zero if various offsets are sufficiently cancelled in the digital value generation circuit 400. In this case, the addition for the average value Av may be omitted. If the average value Av becomes a gradation value of substantially "0", the count of the no-storage signals may be reduced due to random noise in the counting of the amount of signal (gradation value) in the digital value generation circuit 400 to become a digital value with a minus value. The digital value needs to remain to be a minus value in order for the adjustment value calculation unit 551 to detect an average and a standard deviation correctly. Therefore, the digital value generation circuit 400 does not round up the digital value to, for example, a gradation value of "0" and supplies the digital value remaining to be the minus value to the adjustment value calculation unit 551.

The adjustment value calculation unit 551 calculates the threshold value Vth using the above-mentioned Equation 2, and then uses the lookup table to detect an adjustment value corresponding to the amount of signal (gradation value) closest to the amount of signal of the calculated threshold value Vth. The adjustment value calculation unit 551 then supplies the detected adjustment value to the adjustment value holding unit 210 and causes the adjustment value holding unit 210 to hold the adjustment value as the adjustment value of the pixel that output the no-storage signal.

In the first embodiment of the present technology, the example of causing an adjustment value to be held for each pixel was described. The example is the best in the accuracy of the binary decision. However, it takes time to generate an adjustment value (calibration) and a necessary capacity of a memory is also increased. Hence, if the main cause of variations is the amplifier unit for each column and there are substantially no variations in the amplifier transistors of the pixels, it is also conceivable that an adjustment value is set for each column. Moreover, if variations in the manufacture of imaging devices are large, and it becomes a main cause of variations in gain, a decision threshold value may be set for each imaging device.

[An Operation Example of the Adjustment Value Calculation Unit]

Next, the adjustment value calculation operation by the adjustment value calculation unit 551 of the adjustment apparatus 550 in the first embodiment of the present technology is described with reference to the drawings.

Figure 11:
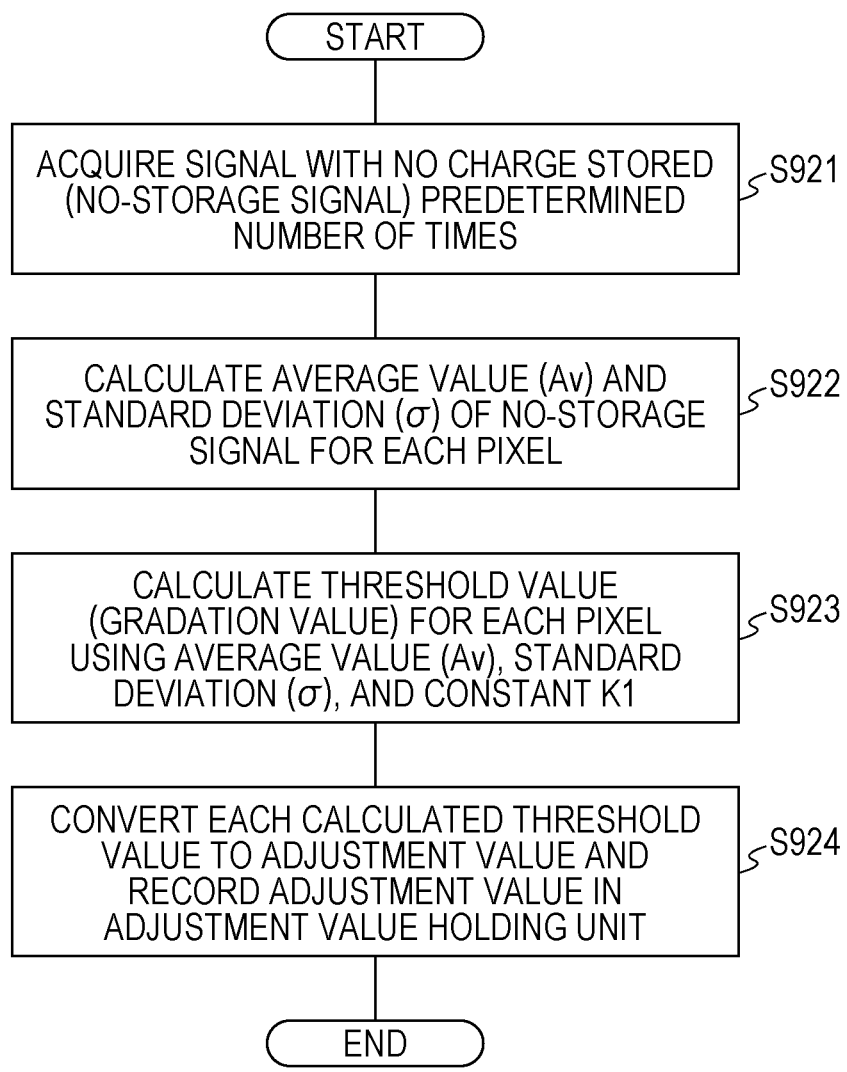
FIG. 11 is a flowchart illustrating an example of a procedure for an adjustment value calculation process by the adjustment value calculation unit 551 of an adjustment apparatus 550 in the first embodiment of the present technology.

FIG. 11 is a flowchart illustrating an example of a procedure for an adjustment value calculation process by the adjustment value calculation unit 551 of the adjustment apparatus 550 in the first embodiment of the present technology.

Firstly, the adjustment value calculation unit 551 acquires a signal with no charge stored (a no-storage signal) generated by the imaging device 100 targeted for the setting of adjustment values, the required number of times to generate a frequency distribution (a predetermined number of times) (Step S921). The average value (Av) and standard deviation (σ) of the no-storage signals are calculated for each pixel based on the frequency distribution of the no-storage signals of each pixel (Step S922).

Next, the calculated average value (Av), the calculated standard deviation (σ), and the constant K1 are used to calculate a threshold value (gradation value) for each pixel (Step S923). The calculated pixel-specific threshold values are subsequently converted into pixel-specific adjustment values, respectively. The converted adjustment values are recorded in the adjustment value holding unit (Step S924). The procedure for the adjustment value calculation process ends.

In this manner, according to the first embodiment of the present technology, the adjustment value holding unit 210 is caused to hold adjustment values. Accordingly, it is possible to set a threshold value separately according to the variation of gain (the variation of conversion efficiency) and make a binary decision. Consequently, according to the first embodiment of the present technology, the accuracy of a decision on a photon incident on a pixel can be improved.

In FIG. 1, the description was given assuming the case where the amplifier unit 440 is provided. However, the configuration is not limited to this. For example, also if the amplifier unit 440 is not included (if the amplification factor is one or less as in a pixel including a normal source follower amplifier transistor), a case where the conversion efficiencies of the amplifier transistors vary largely is assumed. In this case, a binary decision is made using a pixel-specific adjustment value as in the first embodiment of the present technology. Accordingly, the accuracy of a decision on a photon incident on a pixel can be improved.

[Modifications]

In the first embodiment of the present technology thus far illustrated with reference to FIGS. 1 to 11, the binary decision using an adjustment value is focused on and the description of the amplifier unit 440 whose various examples are conceivable is omitted.

Hence, in FIGS. 12 to 20, the amplifier unit 440 whose various examples are conceivable is described taking a plurality of amplification methods as modifications.

Firstly, an example of the amplifier unit 440 configured of an operational amplifier provided to each column is described with reference to FIGS. 12 to 16.

[An Example of the Amplifier Unit Configured of an Operational Amplifier]

Figure 12:
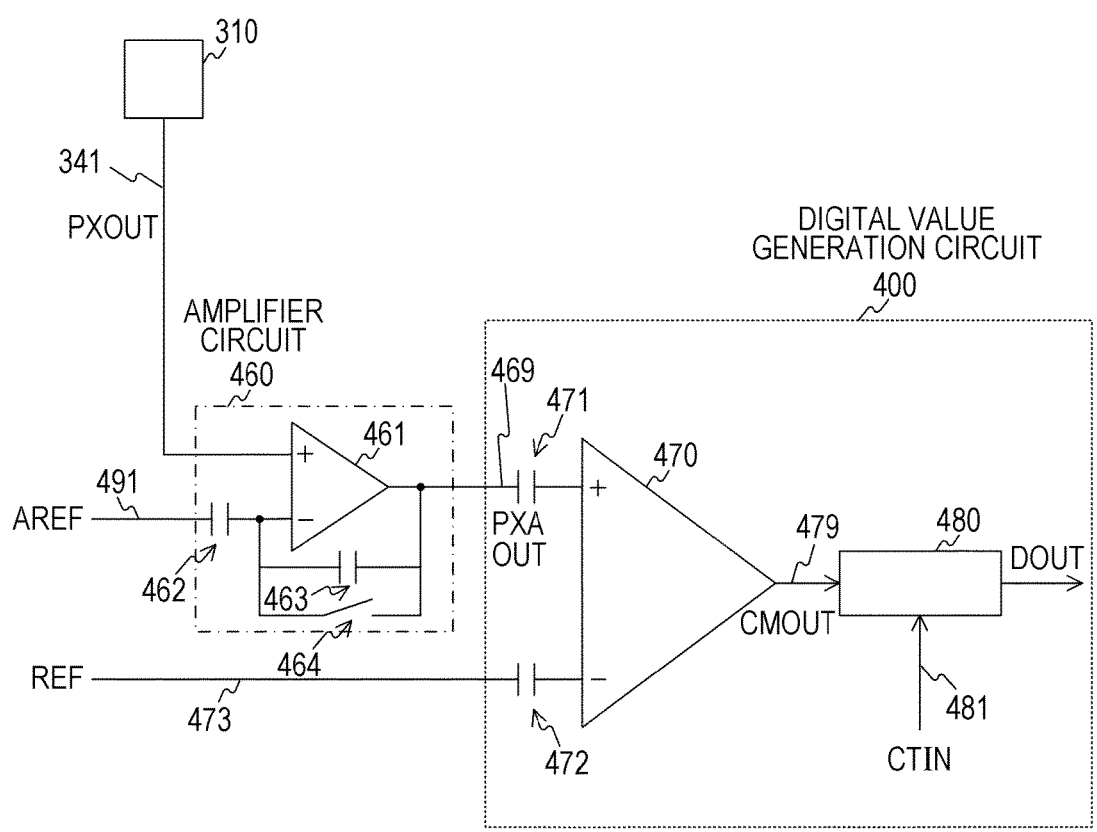
FIG. 12 is a diagram schematically illustrating an example of a circuit configuration example of an amplifier unit 440 of an operational amplifier, which is illustrated as a first modification of the first embodiment of the present technology.

FIG. 12 is a diagram schematically illustrating an example of a circuit configuration example of the amplifier unit 440 of an operational amplifier, which is illustrated as a first modification of the first embodiment of the present technology.

FIG. 12 also illustrates an example of a circuit configuration example of the digital value generation circuit 400 together for convenience of description.

FIG. 12 illustrates an amplifier circuit 460 as a circuit configuration of the amplifier unit 440 configured of an operational amplifier, and a comparator 470, capacitors 471 and 472, and a counter 480 as circuit configurations of the digital value generation circuit 400. Moreover, FIG. 12 illustrates the vertical signal line 341 connected to the amplifier circuit 460 and part of the pixels 310 connected to the vertical signal line 341 together.

The amplifier circuit 460 includes an amplifier 461, capacitors 462 and 463, and a switch 464.

The amplifier 461 is connected at its positive input terminal (+ terminal) to the vertical signal line 341, and at its negative input terminal (− terminal) to one of electrodes of the capacitor 462, one of electrodes of the capacitor 463, and the switch 464. Moreover, the amplifier 461 is connected at its output terminal to one of electrodes of the capacitor 471, the other electrode of the capacitor 463, and the switch 464.

Moreover, the capacitor 471 is connected at the other electrode to a positive input terminal (+ terminal) of the comparator 470. The capacitor 472 is connected at one of electrodes to a REF signal line 473 and at the other electrode to a negative input terminal (− terminal) of the comparator 470. Moreover, an output terminal of the comparator 470 is connected to the counter 480.

Here, the amplifier circuit 460 is described. The amplifier circuit 460 amplifies a signal supplied from the pixel 310 via the vertical signal line 341 (illustrated as "PXOUT" in FIG. 12) by N times (N>1). In other words, the amplifier circuit 460 corresponds to the amplifier unit 440 in the functional configuration example illustrated in FIGS. 4a and 4b.

The amplifier circuit 460 sets a potential at the + terminal first to a predetermined intermediate potential, and then brings the switch 464 into conduction to perform the auto zero operation. Consequently, a potential at the − terminal becomes the same as the potential at the + terminal. After the switch 464 is brought out of conduction, a signal supplied to the + terminal is amplified. In the amplification, the difference between the potential (intermediate potential) at the − terminal and the potential at the + terminal is amplified by N times (N>1) using a capacitive divider to be output in the forward direction (non-inversely).

In terms of the auto zero operation of the amplifier circuit 460, for example, the potential of the reset signal of the pixel 310 is set to the intermediate potential, and the auto zero operation is executed concurrently with the amplification of the reset signal at the timing when the pixel 310 outputs the reset signal. In this case, offset components generated in the pixel 310 (the offset components of the pixel 310) are cancelled by the auto zero operation. However, a signal output from the output terminal of the amplifier circuit 460 (illustrated as "PXAOUT" in FIG. 12) includes offset components unique to the amplifier circuit 460. The offset components include, for example, switching noise generated on the − terminal side due to the feedthrough of the switch 464 upon the completion of the auto zero operation, and kTC noise of the amplifier circuit 460. These offsets are amplified by N times as in the signal upon the amplification of the signal (PXOUT) of the pixel 310. In other words, the signal (PXAOUT) output from the output terminal of the amplifier circuit 460 includes a very large amount of offset components.

The capacitors 471 and 472 are capacitors of equal capacity provided at the + and − terminals of the comparator 470. The capacitors 471 and 472 hold charge for performing ACDS in the electrode (the other electrode) of the capacitor 471 on the + terminal side of the comparator 470 and the electrode (the other electrode) of the capacitor 471 on the − terminal side of the comparator 470. Consequently, after the offset components of the pixel 310 and the offset components of the amplifier circuit 460 are removed (cancelled) from PXAOUT, the potentials of PXAOUT and REF are compared by the comparator 470. For example, if the capacitors 471 and 472 are caused to hold the charge of the reset signal, and the reset signal is supplied to the + terminal of the comparator 470, a signal (no-signal) where the charge of the reset signal has been cancelled is supplied to the + terminal of the comparator 470. For example, offset components generated in the pixel 310 are cancelled when the amplifier circuit 460 performs the auto zero operation setting the potential of the reset signal to the intermediate potential. Accordingly, only the offset components of the amplifier circuit 460 are cancelled.

The comparator 470 compares the potential at the + terminal (the potential of PXAOUT) and the potential at the − terminal (the potential of the REF signal) and outputs a signal in accordance with a higher potential terminal side. For example, the comparator 470 outputs a signal of the highest potential (referred to as the H level) if the potential at the + terminal is higher than the potential of the REF signal (referred to as "REF"), and outputs a signal of the lowest potential (referred to as the L level) if the potential of PXAOUT is lower than the potential of REF. The comparator 470 makes a comparison twice: when the potential at the + terminal is the potential of the reset signal, and when the potential at the + terminal is the potential of the storage signal. When the potential at the + terminal is the potential of the reset signal, the comparator 470 supplies a signal of the comparison result (illustrated as "CMOUT") to the counter 480.

The counter 480 makes a count for generating a digital value based on the signal (CMOUT) of the comparison result of the comparator 470 and a clock signal (CTIN) supplied from a clock signal line 481. The counter 480 counts down from an initial value (for example, "0") in a case of a reset signal count. The counter 480 then counts up from a count value of the down counting result in a case of a storage signal count. Up counting from the count value of the down counting result corresponds to the subtraction of the subtractor 424 illustrated in FIGS. 4a and 4b. The counter 480 outputs a signal (DOUT) indicating a digital value of the up counting result. The counter 480 and the comparator 470 correspond to the DCDS unit 420 in the functional configuration example illustrated in FIG. 4a. Moreover, the capacitors 471 and 472 correspond to the ACDS unit 410 in the functional configuration example illustrated in FIG. 4a.

Here, the comparison made by the comparator 470 and the count made by the counter 480 are described. The comparison made by the comparator 470 is for digitizing the reset signal and the storage signal. Hence, upon comparison, the potential of the REF signal supplied via the REF signal line 473 is set to a ramp waveform. Moreover, in a period during which the potential of the REF signal is set to a ramp waveform, a clock signal is supplied with a pulse corresponding, one on one, to each step of the ramp waveform. The pulse starts being supplied in synchronization with the start timing of the ramp waveform. The counter 480 counts the number of pulses from the start of the ramp waveform up to the inversion of the signal of the comparison result of the comparator 470 (the transition from the L level to the H level) to generate a digital value.

An amount in accordance with gradation when the storage signal is converted into a digital value is set for the amount of potential dropping at each step of the ramp waveform (potential difference of a step height). In other words, the potential difference of the step height is increased by N times as in the amplification factor as compared to an imaging device (another imaging device) without the amplifier circuit 460.

Moreover, when a digital decision is made on the reset signal (during a reset signal count period (see FIG. 13), the offset components in the pixel 310 and the amplifier 461 have already been cancelled by ACDS. Hence, in the digital decision of the reset signal, a digital decision is made only on the offset components of the comparator 470 itself. The magnitude of the offset components of the comparator 470 itself is not amplified by the amplifier circuit 460 and therefore is the same as that of the imaging device (the other imaging device) without the amplifier circuit 460. Hence, the potential difference between the start (start of a scan) and the end (end of the scan) of the ramp waveform in the reset signal count period in the imaging device including the amplifier circuit 460 (a scan target potential difference (see a potential difference D1 of FIG. 13)) becomes the same as the imaging device (the other imaging device) without the amplifier circuit 460.

Next, an example of a timing chart indicating the operations of the amplifier circuit 460 and the digital value generation circuit 400, which are illustrated in FIG. 12, is described with reference to FIG. 13.

[An Example of the Timing Chart]

Figure 13:
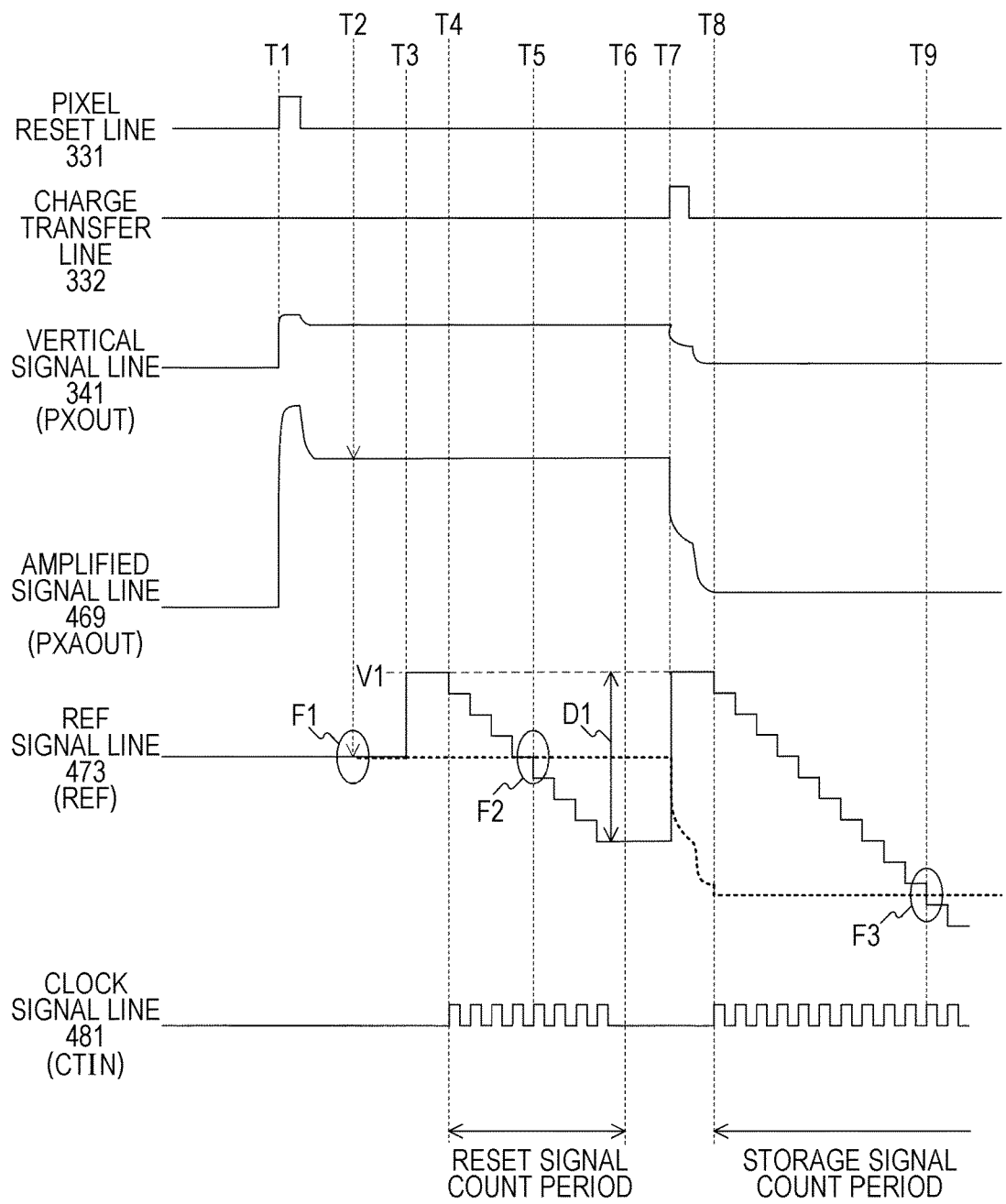
FIG. 13 is a timing chart illustrating an example of the operations of an amplifier circuit 460 illustrated as the first modification of the first embodiment of the present technology and the digital value generation circuit 400.
Figure 14:
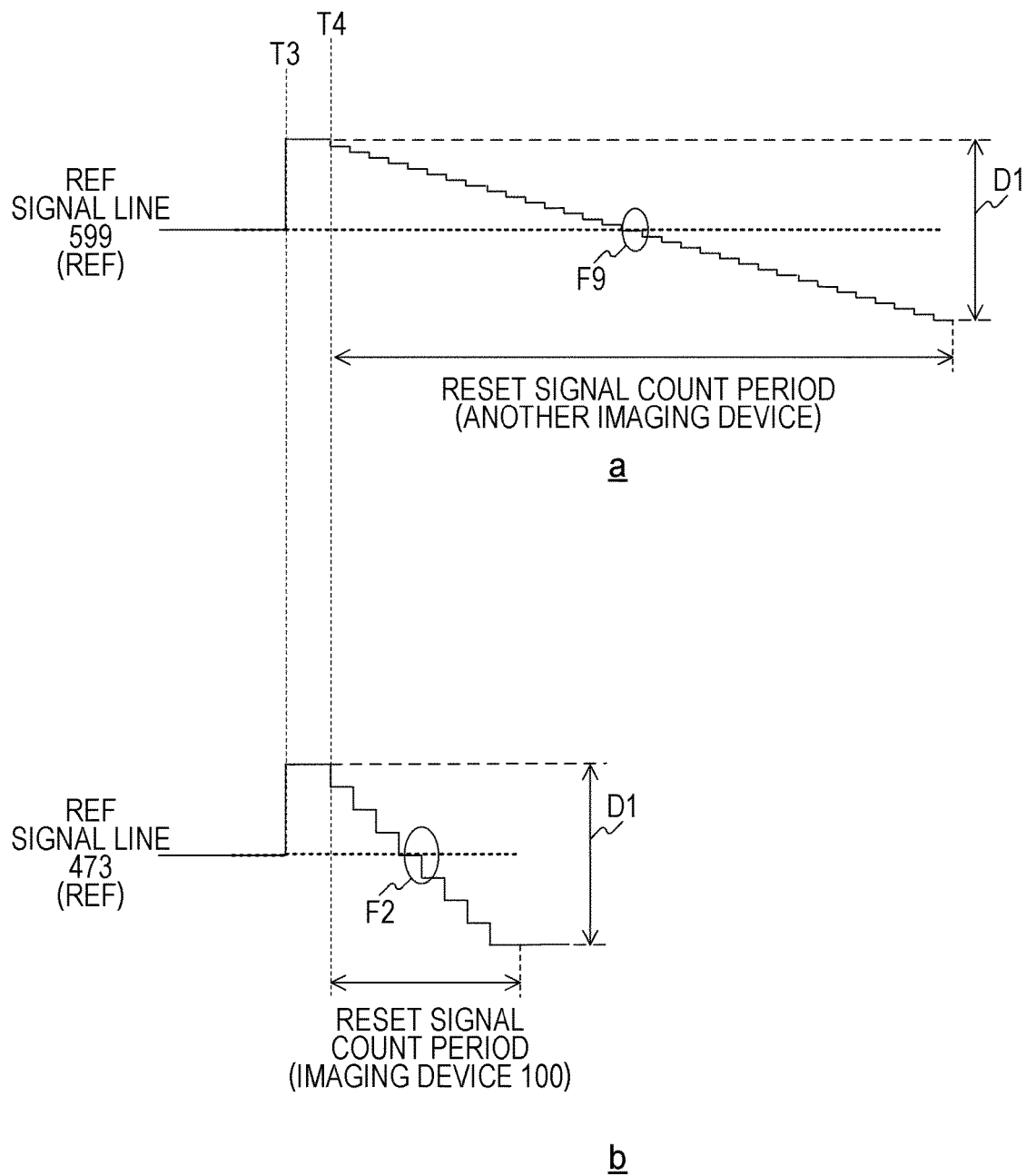
FIGS. 14a and 14b are diagrams schematically illustrating a reset signal count period of the imaging device 100 including the amplifier circuit 460 illustrated as the first modification of the first embodiment of the present technology and the digital value generation circuit 400, and a reset signal count period of another imaging device.

FIG. 13 is a timing chart illustrating an example of the operations of the amplifier circuit 460 and the digital value generation circuit 400, which is illustrated as the first modification of the first embodiment of the present technology.

Here, the horizontal axes are set as common time axes.

Changes in the potentials of the pixel reset line 331, the charge transfer line 332, the vertical signal line 341, an amplified signal line 469, the REF signal line 473, and the clock signal line 481 are illustrated by the solid lines. Moreover, here, in order to give a description checking changes in the potential of the amplified signal line 469 against changes in the potential of the REF signal line 473, changes in the potential of the amplified signal line 469 at timing T2 or later are illustrated by the broken line superimposed on the REF signal line 473. The lengths of the time axes are schematic, and do not illustrate the ratio of time lengths between timings.

In FIG. 13, for convenience of description, the period during which a digital decision is made on the storage signal (a storage signal count period) is illustrated until the middle of it for description. Moreover, in FIG. 13, a description is given focusing on predetermined timings (timings T1 to T8) during the operational transition from the output of the reset signal from the pixel 310 to the determination of the digital value of the storage signal (the net digital value). In FIG. 13, a description is given assuming that the amplifier circuit 460 amplifies a signal by four times and outputs the signal.

Firstly, at timing T1, a reset pulse is supplied to the gate terminal of the reset transistor 313 of the pixel 310 via the pixel reset line 331. Consequently, the signal at a reset level (the reset signal) is supplied to the vertical signal line 341 so that the potential of the vertical signal line 341 transitions to the potential of the reset signal. The transition of the potential in the vertical signal line 341 is amplified by four times by the amplifier circuit 460 and output to the amplified signal line 469. In other words, the amount of the transition of the potential (the potential difference) of the amplified signal line 469 at timing T1 is four times the potential difference in the vertical signal line 341. At timing T1, the potential of the reset signal of the pixel 310 is set to the intermediate potential, and the auto zero operation of the amplifier circuit 460 is performed.

When the reset pulse that rose at timing T1 falls, the potential of the vertical signal line 341 also slightly drops due to the influence of coupling. The potential of the amplified signal line 469 also drops by approximately four times the amount of the transition of the potential (the potential difference) of the vertical signal line 341. The potential of the amplified signal line 469 at the time when dropping due to the influence of coupling and becoming stable is used as the potential of the reset signal amplified by four times in the digital value generation circuit 400.

Next, at timing T2, the charge for performing analog CDS is held in the capacitor 471 connected to the + terminal of the comparator 470 and the capacitor 472 connected to the − terminal of the comparator 470. The charge is held by, for example, in the operation of deciding the determination reference voltage of the comparator 470 (the auto zero operation), turning on/off a transistor in the comparator 470 to cause the voltages applied to the + and − terminals of the comparator 470 to be balanced, and causing the balanced voltages to be held respectively (see, for example, Japanese Patent Application Laid-Open No. 2008-193373). When the auto zero operation is complete, the potential of the reset signal supplied to the + terminal of the comparator 470 becomes a relative potential of the reference signal (a frame F1 of FIG. 13) and can be regarded as the no-signal. The holding of charge at timing T2 corresponds to the sampling and holding of the reset signal described in FIGS. 4a and 4b.

At timing T3, the potential of the REF signal line 473 is transitioned to a potential (V1) at the start of the ramp waveform. If the REF signal line 473 is shared among a plurality of comparators 470, a potential difference to be transitioned at timing T3 becomes common to the plurality of comparators 470. Hence, a potential difference that the potential of the REF signal agrees with the potential of the reset signal in the middle of the ramp waveform in all the comparators 470 is set as the potential of the REF signal line 473. In other words, the potential difference of the REF signal line 473 is set in such a manner as to be able to respond to (to include) an offset where the potential of a signal input from the + terminal of the comparator 470 rises the most among offsets varying according to the comparator 470.

Next, at timing T4, a stepped pulse starts being supplied to the REF signal line 473 and a period during which the reset signals output by the pixel 310 are counted (the reset signal count period) starts. In other words, at timing T4, the first stepped pulse is supplied to the REF signal line 473. Moreover, at timing T4, a pulse in synchronization with the stepped pulse starts being supplied in the clock signal line 481. The counter 480 then starts counting down in accordance with the number of pulses of the clock signal line 481. Down counting is counting from an initial value (for example, "0") of the value of a count by the counter 480 (a count value). Down counting is performed until the signal (CMOUT) output from the comparator 470 is inverted.

At timing T5, if the potential of the − terminal of the comparator 470 becomes lower than the potential of the + terminal of the comparator 470, the output signal (CMOUT) of the comparator 470 is inverted to stop the down counting of the counter 480. In other words, at a timing (a frame F2 of FIG. 13) when the relationship between the potentials of the + and − terminals of the comparator 470 is inverted, counting is stopped. The count value of the count by down counting is then held until a storage signal count. The count value generated by down counting corresponds to the AD conversion result of the no-signal (the digital no-signal) described in FIGS. 4a and 4b. In other words, the count value generated by down counting corresponds to a value of the digitized offset components of the comparator 470.

At timing T6, when a predetermined number of steps ends and the ramp waveform for counting the reset signals ends, the reset signal count period ends. The scan target potential difference (the potential difference D1 of FIG. 13) between the start and the end of the ramp waveform in the reset signal count period is set in such a manner as to be able to respond to an offset where the potential rises the most and an offset where the potential drops the most among the offsets that vary according to the comparator 470. Moreover, the potential difference D1 is set in such a manner as that excessive steps are minimized to shorten the time length of the reset signal count period.

At timing T7, the potential of the REF signal transitions to the potential (V1) at the start of the ramp waveform. In other words, the potential of the REF signal returns to the same state as the one at timing T3, and the output signal (CMOUT) of the comparator 470 also returns to the potential to be counted by the counter 480. Moreover, at timing T7, a transfer pulse is supplied to the gate terminal of the transfer transistor 312 of the pixel 310 via the charge transfer line 332. Consequently, a signal in accordance with the stored charge (the storage signal) is supplied to the vertical signal line 341. The potential of the vertical signal line 341 then transitions to the potential in accordance with the storage signal.

As in timing T1, the transition of the potential in the vertical signal line 341 is amplified by four times by the amplifier circuit 460. Moreover, as in the falling edge of the reset pulse at timing T1, also at the falling edge of the transfer pulse, the potentials of the amplified signal line 469 and the vertical signal line 341 slightly drop due to the influence of coupling. The potential at the time when dropping due to the influence of coupling and becoming stable is used as the potential of the storage signal amplified by four times in the digital value generation circuit 400.

Next, at timing T8, a stepped pulse starts being supplied to the REF signal line 473 and a period during which the storage signals output by the pixel 310 are counted (the storage signal count period) starts. Moreover, as in timing T4, a pulse in synchronization with the stepped pulse is supplied to the clock signal line 481. In the storage signal count period, the counter 480 counts up and continues counting until the output signal (CMOUT) of the comparator 470 is inverted. In terms of up counting, up counting is performed from the count value of the down counting result in the reset signal count period.

At timing T9, if the potential of the − terminal of the comparator 470 becomes lower than the potential of the + terminal of the comparator 470 (the frame F2 of FIG. 13), the output signal (CMOUT) of the comparator 470 is inverted to stop the up counting of the counter 480, and the count value is held. The held count value is output as the result (pixel value) of the digital decision of the storage signal of the pixel 310.

The held count value corresponds to the subtraction result (the net digital value) of the subtractor 424 described in FIGS. 4a and 4b. In other words, the count value held after up counting from the down counting result is a net pixel value obtained by cancelling the offset components of the pixel 310, the offset components of the amplifier circuit 460, and the offset components of the comparator 470.

Here, a description is given focusing on each offset component (offset components caused by the pixel 310, offset components caused by the amplifier circuit 460, and offset components caused by the comparator 470). At timing T1, when the potential of the reset signal of the pixel 310 is set to the intermediate potential and the auto zero operation of the amplifier circuit 460 is performed, the offset components caused by the pixel 310 are cancelled by the auto zero operation of the amplifier circuit 460. However, the signal of the amplified signal line 469 includes the offset components caused by the amplifier circuit 460. The offset components caused by the amplifier circuit 460 are cancelled by the analog CDS operation at timing T2.

In the analog CDS operation at timing T2, the offset components caused by the comparator 470 (an offset existing in the comparator 470, kTC noise generated by the auto zero operation of the comparator 470, feedthrough, and the like) are not cancelled. However, the offset components caused by the comparator 470 are cancelled by digital CDS by the down counting of the reset signal and the up counting of the storage signal.

Next, amplification by the amplifier circuit 460 and the reset signal count are described. As described in FIG. 13, the potential difference of the step height of the ramp waveform multiplies four times since the signal from the pixel 310 is amplified by four times in the amplifier circuit 460. In other words, the resolution of AD conversion requires a quarter of the accuracy of the imaging device (the other imaging device) without the amplifier circuit 460.

Moreover, since the potential difference is four times, the gradient of the slope of the ramp waveform multiplies four times. Furthermore, as described in FIGS. 5a and 5b, the potential difference between the start and the end of the ramp waveform in the reset signal count period (the potential difference D1 of FIG. 13) is the same as that of the other imaging device. Since the same potential difference is scanned with the gradient that has multiplied four times, the time length of the reset signal count period in the imaging device (the imaging device 100) including the amplifier circuit 460 is ¼ times the time length of the other imaging device.

Here, a description is given of the potential difference between the start and the end of the ramp waveform in the storage signal count period (the scan target potential difference in the storage signal count period). The potential difference is set in such a manner as that the transition of a potential obtained by adding the offset components caused by the comparator 470 and the storage signal can be detected. In other words, the scan target potential difference in the storage signal count period is a potential difference obtained by adding the potential difference D1 of the reset signal count period and the potential difference for detecting the storage signal. Since the output signal of the pixel 310 is multiplied by N times, the potential difference for detecting the storage signal is N times the potential difference of the imaging device (the other imaging device) without the amplifier circuit 460. On the other hand, the potential difference D1 in the reset signal count period is the same as that of the other imaging device. In other words, as the detection time of the offset components of the comparator 470 becomes longer in the storage signal count period, the ratio formed by a time period during which the time length is ¼ times is increased, and the time length of the storage signal count period becomes shorter than that of the other imaging device.

The imaging device 100 is an imaging device for detecting faint light so that the storage signal is very small. In other words, in the time length of the storage signal count period, the ratio formed by the detection period of the offset components of the comparator 470 is very large.

In other words, it is possible, by providing the amplifier circuit 460, to significantly shorten the detection time of the offset components of the comparator 470 occupying a large proportion of the time required for AD conversion upon the detection of faint light.

Next, a description is given of the difference between the reset signal count period in the imaging device (the imaging device 100) including the amplifier circuit 460 and the reset signal count period in the other imaging device.

[An Example of a Difference of the Reset Signal Count Period]

FIGS. 14a and 14b are diagrams schematically illustrating the reset signal count period of the imaging device 100 including the amplifier circuit 460 illustrated as the first modification of the first embodiment of the present technology and the digital value generation circuit 400, and the reset signal count period of the other imaging device.

FIG. 14a illustrates changes in the potential of a line (a REF signal line 599) that supplies the REF signal of the other imaging device in the reset signal count period. FIG. 14b illustrates changes in the potential of the REF signal line 473 of the imaging device (the imaging device 100) of the first modification of the first embodiment of the present technology. The changes in potential illustrated in FIG. 14b are similar to those described in FIG. 13. Therefore, the description is omitted here.

As illustrated in FIGS. 14a and 14b, the scan target potential difference (the potential difference D1) is the same between the other imaging device and the imaging device 100. On the other hand, in terms of the potential difference of the step height of the ramp waveform, the potential difference of the imaging device 100 is N times the potential difference of the other imaging device. Hence, the time length of the reset signal count period of the imaging device 100 (the reset signal count period (the imaging device 100)) is 1/N times the time length of the other imaging device (the reset signal count period (the other imaging device)).

Next, a description is given of the table providing a summary of the differences between the ramp waveform of the imaging device 100 and the ramp waveform of the other imaging device, with reference to FIGS. 15a and 15b.

[An Example of Differences of the Ramp Waveform]

FIGS. 15a and 15b are tables for comparing the ramp waveform of the REF signal in the first modification of the first embodiment of the present technology with the ramp waveform of the REF signal in the other imaging device.

In FIGS. 15a and 15b, a description is given assuming that a signal generated by the pixel 310 is amplified by N times by the amplifier circuit 460 with reference to the ramp waveform in the other imaging device (illustrated as "×1" in FIGS. 15a and 15b).

The details of the ramp waveform in the imaging device 100 were described in FIGS. 12 to 14b. Therefore, a brief description is given here.

The table of FIG. 15a illustrates a table for comparing ramp waveforms in the reset signal count period.

As illustrated in the table of FIG. 15a, in terms of the potential difference of the step height of the ramp waveform of the REF signal, a potential difference being N times (×N) the potential difference (×1) in the other imaging device is set in the imaging device 100.

Moreover, in terms of the scan target potential difference in the reset signal count period (the difference between a potential at the start and a potential at the end of the ramp waveform in the reset signal count period), the same potential difference (×1) as a scan target potential difference (×1) of the other imaging device is set in the imaging device 100.

In terms of the number of steps in the reset signal count period, the number of steps being 1/N times (×1/N) the number of steps (×1) of the other imaging device is set in the imaging device 100.

In other words, the time length of the reset signal count period in the imaging device 100 is the time length being 1/N times (×1/N) the time length (×1) of the other imaging device.

The table of FIG. 15b illustrates a table for comparing ramp waveforms in the storage signal count period.

The potential difference of the step height of the ramp waveform of the REF signal in the storage signal count period is similar to the one in the reset signal count period.

In terms of the scan target potential difference in the storage signal count period, an equivalent to the potential difference for detecting the offset components of the comparator 470 is the same (×1) as that of the other imaging device. On the other hand, an equivalent to the potential difference for detecting the storage signal is N times (×N) the potential difference in the other imaging device. In other words, as a proportion of the potential difference for detecting the offset components of the comparator increases in the scan target potential difference in the storage signal count period, the scan target potential difference in the storage signal count period approaches the potential difference of the other imaging device.

Moreover, in terms of the number of steps in the storage signal count period, an equivalent to the number of steps for detecting the offset components of the comparator 470 is 1/N times the number of steps of the other imaging device. On the other hand, an equivalent to the number of steps for detecting the storage signal is the same (×1) as the number of steps in the other imaging device.

Moreover, in terms of the time length of the storage signal count period, an equivalent to the time length for detecting the offset components of the comparator 470 is 1/N times the time length of the other imaging device. On the other hand, an equivalent to the time length for detecting the storage signal is the same (×1) as a time length corresponding to the time length of the other imaging device.

In other words, as a proportion of the time length for detecting the offset components of the comparator 470 increases in the time length of the storage signal count period, the time length of the storage signal count period becomes shorter.

In this manner, the amplifier circuit 460 is provided and accordingly the time required for AD conversion of the offset components of the comparator 470 can be reduced.

Here, the reduction of the time required for AD conversion of the offset components of the comparator 470 by providing the amplifier circuit 460 is described considering the value of an offset of the comparator. Here, a description is given assuming that the conversion efficiency of the pixel 310 is 600 pV/e- and the offset of the comparator 470 is several mV to several tens mV.

Firstly, a description is given assuming that there is no amplifier circuit 460. A decision threshold value in a case of making a binary decision on the entrance or non-entrance of one photon is approximately 300 pV, an intermediate value between 0 and 600 pV if no consideration is given to the offset of the comparator 470. Therefore, if no consideration is given to the offset of the comparator 470, when the ramp waveform of the REF signal covers up to approximately 300 pV, a binary decision on the entrance or non-entrance of one photon becomes possible.

However, the offset of the comparator 470 is several mV to several tens mV. Considering the range (0 pV to 600 pV) of the output signal of the pixel 310, the range (several mV to several tens mV) of the offset of the comparator 470 is larger by one digit or more. As illustrated in FIG. 13, the offset of the comparator 470 is cancelled by subtracting an equivalent to the offset components (the down counted value of the reset signal count period) from the count value in the storage signal count period.

In other words, it is necessary to be performed with the same accuracy between the step height (detection accuracy) of the ramp waveform for detecting the output signal of the pixel 310 and the step height (detection accuracy) of the ramp waveform for detecting the offset components of the comparator 470. Let the amount of signal of one photon be S (pV). If AD conversion is not performed with a step height of a ramp waveform sufficiently smaller than S/2 pV, the output signal of the pixel 310 is buried in the quantization error of the offset components of the comparator 470. In other words, if AD conversion is not performed with a step height of a ramp waveform half or lower the amount of signal generated by one photon, the resolution in AD conversion is insufficient.

AD conversion is performed on two values having a difference by one digit or more (the offset of the comparator 470 and the output signal of the pixel 310) with the same detection accuracy. Accordingly, the detection time of the offset of the comparator 470 occupies most of the time of the reset signal count period and the storage signal count period in a decision on the entrance of one photon.

In such a case, when the amplifier circuit 460 is provided which amplifies an output signal from the pixel 310 by four times before the output signal enters the comparator 470, the range (0 pV to 600 pV) of the output signal of the pixel 310 multiplies four times (0 pV to 2400 pV). Moreover, in terms of the detection accuracy being 300 pV (S/2 pV), a quarter (1200 pV) of the detection accuracy is sufficient. As described in FIG. 13, the range (several mV to several tens mV) of the offset of the comparator 470 does not change.

In other words, it becomes possible to increase the step height of a ramp waveform (reduce the detection accuracy) by providing the amplifier circuit 460. In other words, it is possible to reduce only resolution for the offset components of the comparator 470 without reducing resolution for the output signal of the pixel 310 (the detection accuracy with which the entrance or non-entrance of one photon can be detected).

Next, an example where the amplifier unit 440 configured of an inverter is provided to each column is described with reference to FIG. 16.

[An Example of Amplification with an Amplifier Circuit of an Inverter]

Figure 16:
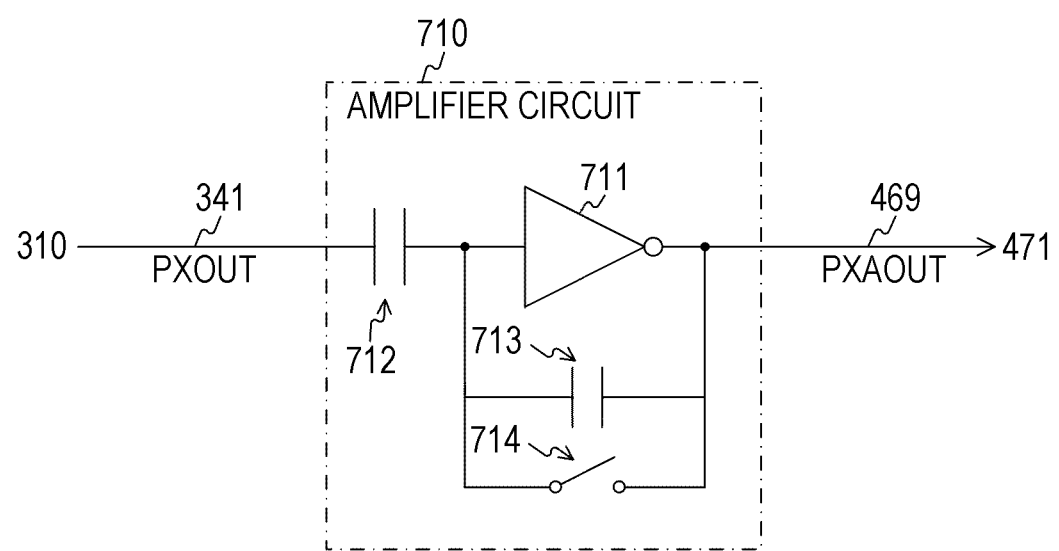
FIG. 16 is a diagram schematically illustrating an example of a circuit configuration example of an amplifier circuit (an amplifier circuit 710) of an inverter, which is illustrated as a second modification of the first embodiment of the present technology.

FIG. 16 is a diagram schematically illustrating an example of a circuit configuration example of an amplifier circuit (an amplifier circuit 710) of an inverter, which is illustrated as a second modification of the first embodiment of the present technology.

The amplifier circuit 710 is provided instead of the amplifier circuit 460 illustrated in FIG. 12, and includes an inverter 711, capacitors 712 and 713, and a switch 714.

The inverter 711 is connected at its input terminal to one of electrodes of the capacitor 712, one of electrodes of the capacitor 713, and one of terminals of the switch 714. Moreover, the inverter 711 is connected at its output terminal to the other electrode of the capacitor 713, the other terminal of the switch 714, and one of electrodes of the capacitor 471 via the amplified signal line 469. Moreover, the capacitor 712 is connected at the other electrode to the pixel 310 via the vertical signal line 341.

The amplifier circuit 710 amplifies an input signal (PXOUT) with a CMOS inverter (the inverter 711) and amplifiers the signal in accordance with the ratio of two capacitors (the capacitors 712 and 713). Since it is an amplifier with an inverter, an output signal (PXAOUT) is 180° out of phase with the input signal (PXOUT).

Moreover, the amplifier circuit 710 has larger 1/f noise generated as random noise than the amplifier circuit 460 illustrated in FIG. 12. Accordingly, generated noise is large. The 1/f noise can be reduced by providing, as a transistor configuring the inverter 711, a transistor with a sufficiently larger area than the amplifier transistor (the amplifier transistor 314 of FIG. 2) provided to each pixel. For example, in a case where the amplifier circuit 710 is provided to the imaging device, if the amplifier circuit 710 is configured to be shared among a plurality of columns (columns), an area assigned to each individual amplifier circuit 710 can be increased.

As illustrated in FIG. 16, the output of a pixel can be amplified by the amplifier (the amplifier circuit 710) using the inverter.

Figure 17:
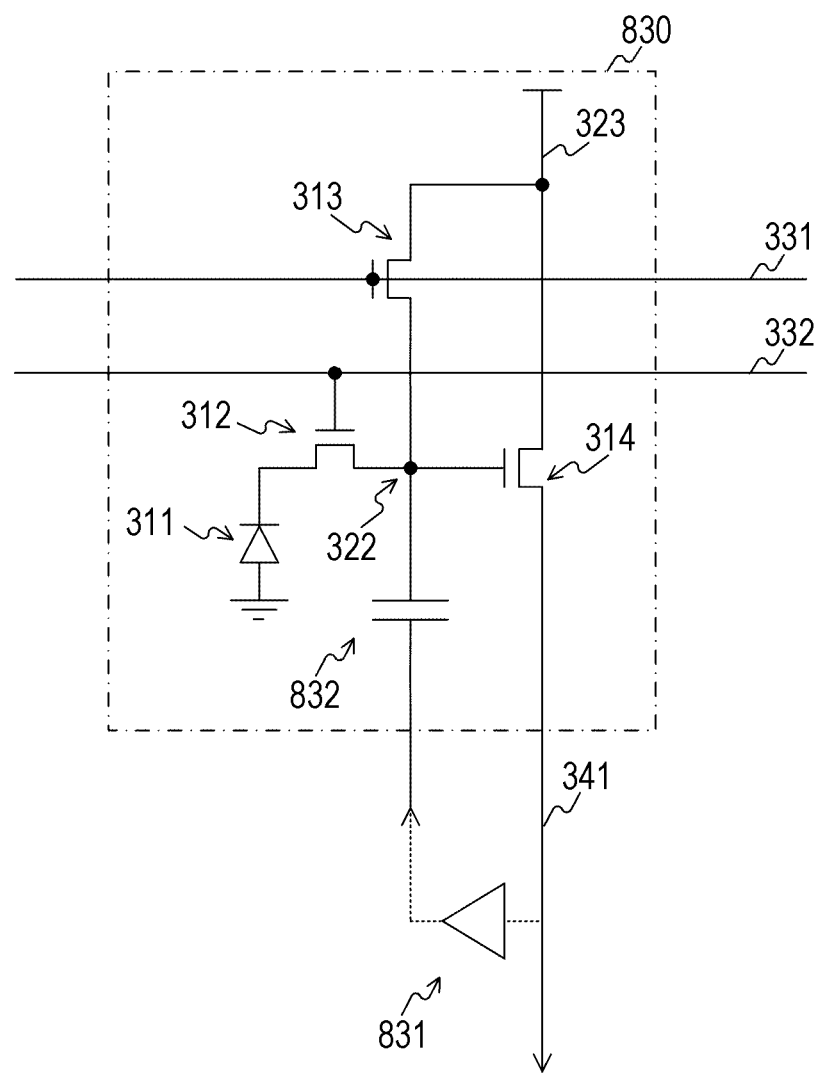
FIG. 17 is a schematic diagram illustrating an example of a circuit configuration of a pixel (a pixel 830) in an example where the output of the pixel is fed back to a floating diffusion illustrated as a third modification of the first embodiment of the present technology.
Figure 18:
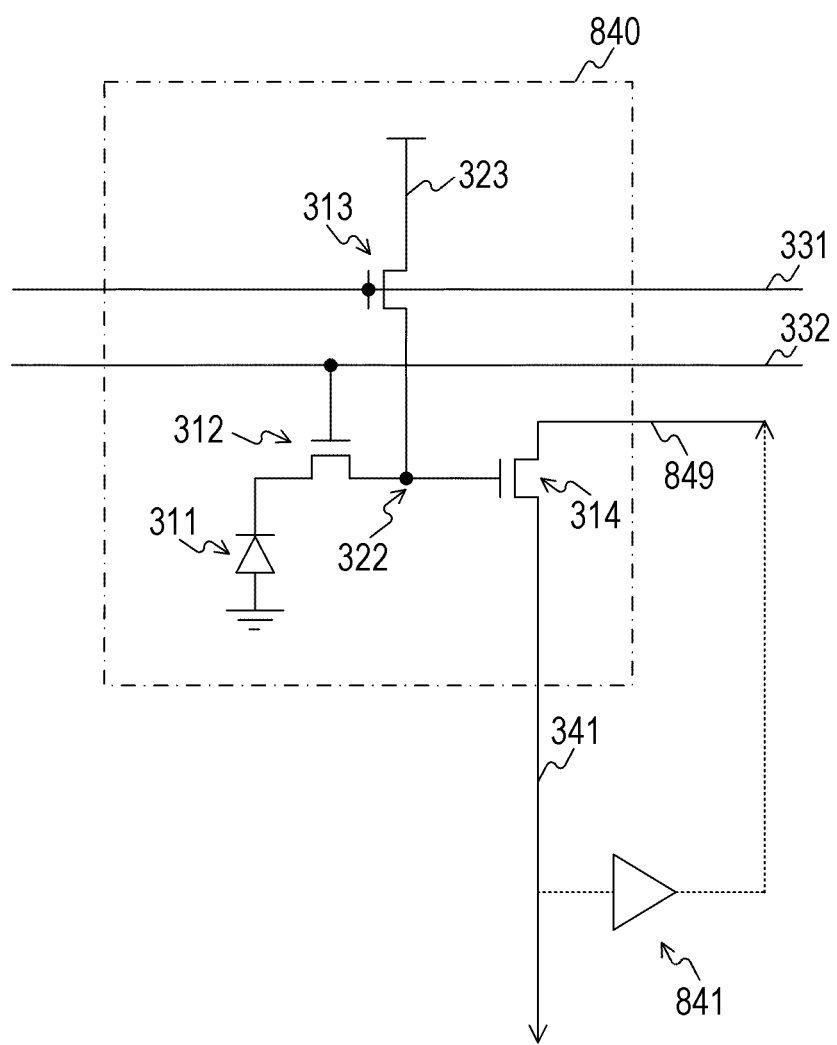
FIG. 18 is a schematic diagram illustrating an example of a circuit configuration of a pixel (a pixel 840) in an example where the output of the pixel is fed back to a drain terminal of an amplifier transistor illustrated as a fourth modification of the first embodiment of the present technology.

Next, an example where the output of a pixel is fed back and amplified is described assuming two feedback methods with reference to FIGS. 17 and 18.

[An Example Where Output is Fed Back and Amplified]

FIG. 17 is a schematic diagram illustrating an example of a circuit configuration of a pixel (a pixel 830) in an example where the output of the pixel is fed back to a floating diffusion illustrated as a third modification of the first embodiment of the present technology.

The pixel 830 includes a capacitor (a capacitor 832) connected at one end to the FD 322 in addition to the configurations of the pixel 310 of FIG. 2. The amplifier transistor 314 is of a source follower type as in FIG. 2, and is provided with a feedback purpose circuit (a feedback purpose amplifier 831), together with the pixels 830, to each column (each vertical signal line 341).

The feedback purpose amplifier 831 is a feedback purpose circuit that feeds the output signal of a pixel supplied to the vertical signal line 341 back to the FD 322 of the pixel that output the output signal. The feedback purpose amplifier 831 is fabricated of, for example, a source follower of a PMOS transistor. In FIG. 17, the illustration of each configuration (the PMOS transistor and a constant current source (a constant current load transistor)) configuring the feedback purpose amplifier 831 is omitted. The feedback purpose amplifier 831 is illustrated as a triangle symbol indicating an amplifier. Moreover, in FIG. 17, in terms of the feedback purpose amplifier 831 that is not provided to each pixel but is provided to each column, signal lines on the input and output sides of the feedback purpose amplifier 831 are illustrated by the broken lines, and is differentiated from the configurations of the pixel for illustration.

The feedback purpose amplifier 831 is connected at its input terminal (a gate terminal of the PMOS transistor) to the vertical signal line 341. An output terminal (a source terminal of the PMOS transistor) of the feedback purpose amplifier 831 is connected to one end of the capacitor 832 provided to each pixel connected to the vertical signal line 341. In other words, in accordance with an output signal supplied to the vertical signal line 341, the feedback purpose amplifier 831 changes the potential of the one end of the capacitor 832 of the pixel that output the output signal. The feedback purpose amplifier 831 is configured of the PMOS transistor, and the relationship between the input and output are in phase with each other. Therefore, positive feedback is provided to the potential of the FD 322.

The capacitor 832 is a capacitor for coupling the output of the feedback purpose amplifier 831 and the FD 322 of the pixel. In other words, the potential of the FD 322 changes in accordance with the output of the feedback purpose amplifier 831 due to capacitive coupling by the capacitor 832.

Although not especially illustrated in FIG. 17, if a plurality of pixels is connected to the vertical signal line 341, the potentials of the FDs 322 of pixels other than the pixel that output the output signal also change. Hence, in order to prevent the change of the potential, a transistor working as a switch is provided to each pixel between the capacitor 832 and the feedback purpose amplifier 831 (illustration omitted). Only a transistor of the pixel that output the output pixel is brought into conduction, and transistors of the other pixels are brought out of conduction. Consequently, feedback is provided only to the FD 322 of the pixel that output the output signal.

In this manner, the output of a pixel can be amplified by being fed back to the FD 322.

FIG. 18 is a schematic diagram illustrating an example of a circuit configuration of a pixel (a pixel 840) in an example where the output of the pixel is fed back to a drain terminal of an amplifier transistor illustrated as a fourth modification of the first embodiment of the present technology.

In the pixel 840, the drain terminal of the amplifier transistor 314 of the pixel 310 of FIG. 2 is not connected to the power line 323 but is connected to a line (a signal line 849) for supplying a potential for the drain terminal of the amplifier transistor 314. The other points are similar to the pixel 310 of FIG. 2. Accordingly, the description is omitted here. A feedback purpose circuit (a feedback purpose amplifier 841), together with the pixels 840, is provided to each column (each vertical signal line 341). The feedback purpose amplifier 841 is similar to the feedback purpose amplifier 831 illustrated in FIG. 17, except that the output is supplied to the signal line 849. Hence, a description is given only of the influence of the output on the potential of the signal line 849.

As illustrated in FIG. 18, in the pixel 840, the output of the feedback purpose amplifier 831 is connected directly to the drain of the amplifier transistor 314. The output of the feedback purpose amplifier 831 is substituted for a known power supply connection. Consequently, in the pixel 840, the potential of the drain terminal of the amplifier transistor 314 changes in accordance with the output of the feedback purpose amplifier 831. A drain diffusion layer of the amplifier transistor 314 has a gate electrode (floating diffusion) and strong parasitic capacitance. Hence, if the potential on the drain side changes, the potential of the gate of the amplifier transistor 314 (the potential of the FD 322) also changes due to the parasitic capacitance between the gate and the drain. In other words, a reduction in the potential of the signal line 849 caused by the output of the feedback purpose amplifier 841 becomes positive feedback to the FD 322 via the parasitic capacitance, and the output signal of the pixel is amplified.

In this manner, the output of a pixel can be amplified also by being fed back to the drain terminal of the amplifier transistor 314.

Figure 19:
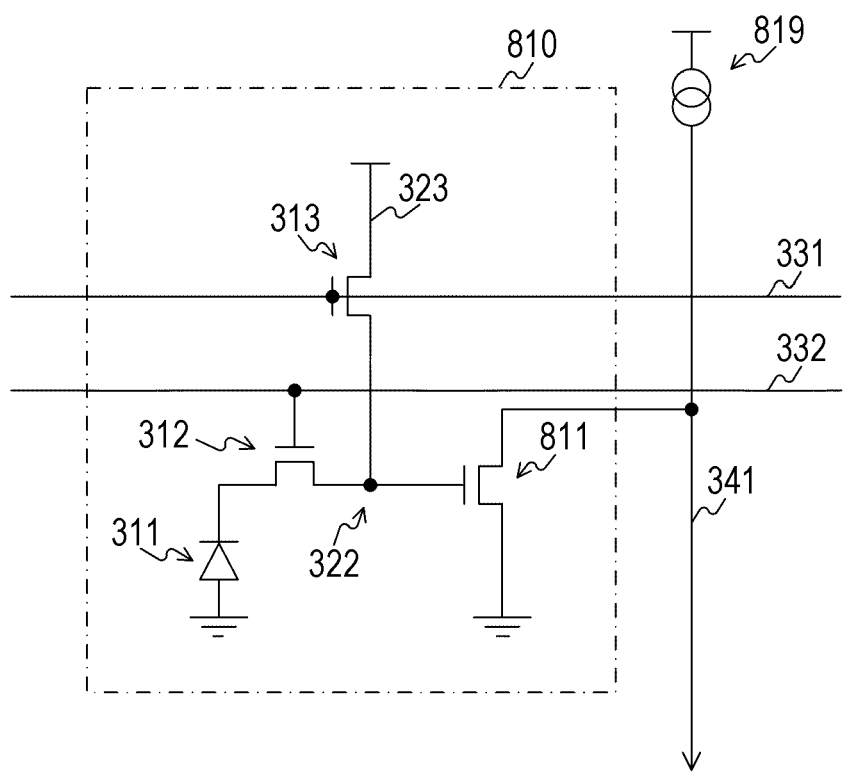
FIG. 19 is a schematic diagram illustrating an example of a circuit configuration of a pixel (a pixel 810) in an example where a common-source NMOS transistor illustrated as a fifth modification of the first embodiment of the present technology is provided as an amplifier transistor to the pixel to amplify output from the pixel.
Figure 20:
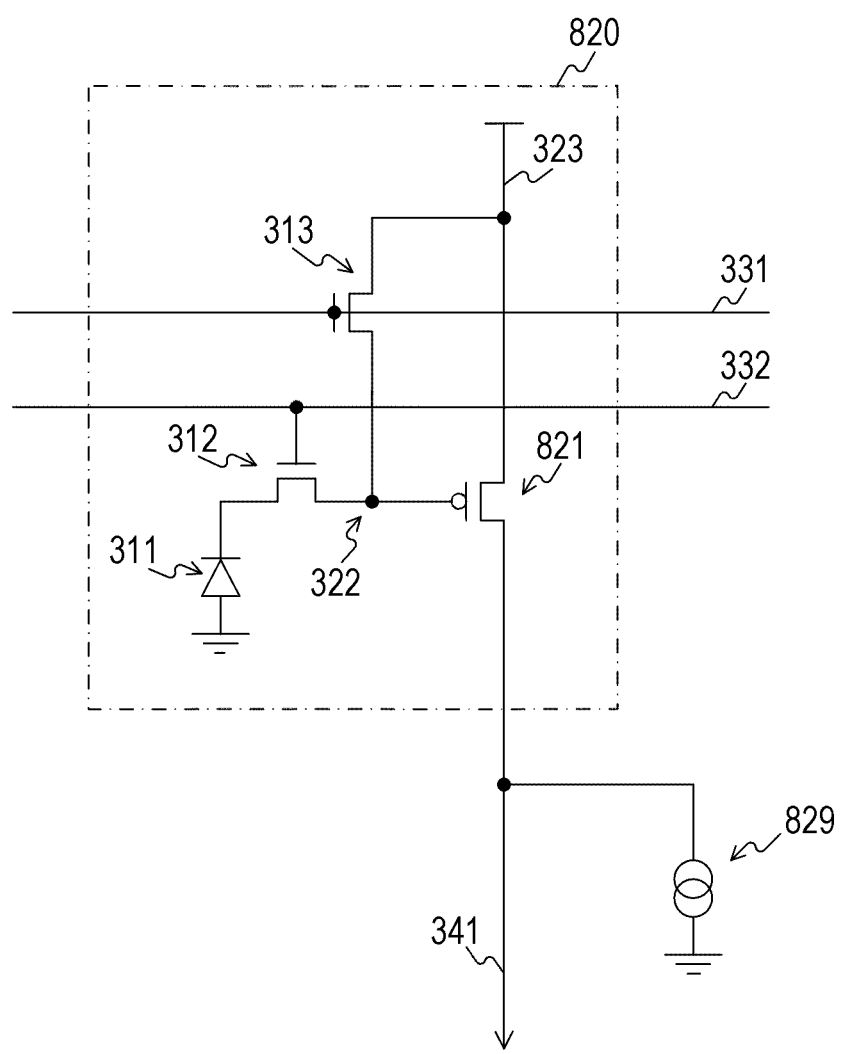
FIG. 20 is a schematic diagram illustrating an example of a circuit configuration of a pixel (a pixel 820) in an example where a common-source PMOS transistor illustrated as a sixth modification of the first embodiment of the present technology, is provided as an amplifier transistor to the pixel to amplify the output of the pixel.

Next, an example where an amplifier is included in each pixel is described as fifth and sixth modifications with reference to FIGS. 19 and 20.

[An Example where a Common-Source Amplifier Transistor is Provided to a Pixel to Amplify Output from the Pixel]

FIG. 19 is a schematic diagram illustrating an example of a circuit configuration of a pixel (the pixel 810) in an example where a common-source NMOS transistor illustrated as the fifth modification of the first embodiment of the present technology is provided as an amplifier transistor to the pixel to amplify output from the pixel.

The pixel 810 includes a common-source amplifier transistor 811 instead of the source follower amplifier transistor 314 provided to the pixel 310 of FIG. 2. The configurations of the pixel excluding the amplifier transistor 811 are similar to those of FIG. 2. Therefore, the same reference numerals as those of FIG. 2 are assigned to the configurations. The descriptions of the configurations excluding the amplifier transistor 811 are omitted here.

The amplifier transistor 811 is an amplifier transistor configured of a common-source NMOS transistor grounded on the source terminal side. A drain terminal of the amplifier transistor 811 is connected to a constant current source 819 and the digital value generation circuit via the vertical signal line 341. The amplifier transistor 811 is a common-source amplifier transistor. Accordingly, the input (the potential of the FD 322) can be amplified to be output to the vertical signal line 341.

The amplification gain of the amplifier transistor 811 is described here. The operation of the amplifier transistor 811 has, for example, the relationship of the following Equation 3.

$$\Delta Id = gm \cdot \Delta Vg + \Delta Vg/Rd \qquad \text{Equation 3}$$

where $\Delta Id$ is the amount of change in drain current from drain current before amplification, gm is transconductance, $\Delta Vg$ is the amount of change in gate voltage from gate voltage before amplification, Rd is drain resistance, and $\Delta Vd$ is the amount of change in drain voltage from drain voltage before amplification.

In the relationship of the above-mentioned Equation 3, if the drain terminal of the amplifier transistor 811 is connected to a constant current load (ΔId=0), the amplification gain (Av) of the amplifier transistor 811 has the relationship of the following Equation 4.

$$Av = \Delta Vd/\Delta Vg = -gm \cdot Rd \quad \text{Equation 4}$$

As can be seen from the minus sign in the above-mentioned Equation 4, the output of the amplifier transistor 811 is 180° out of phase. Moreover, the amplification factor is generally greater (much greater) than one. Accordingly, the output signal of the pixel is amplified by the amplifier transistor 811. In the fifth modification of the present technology, the signal is amplified when being output from the amplifier transistor 811. Therefore, there is no need to provide an amplifier between a pixel and a digital value generation circuit. In other words, if the pixel 810 is provided to an imaging device, the amplifier circuit 460 of the digital value generation circuit 400 illustrated in FIGS. 5a and 5b is omitted. The output of the pixel 810 amplified by the amplifier transistor 811 is supplied directly to the capacitor 471.

The transconductance gm and the drain resistance r are values that slightly change with a change in operating point. Hence, output from the amplifier transistor 811 is lack of linearity. However, if a binary decision is made upon the detection of one photon, only a small amount of electrons is stored. Accordingly, a change in the potential of the FD 322 is small, and the operating point remains substantially constant. Moreover, in the case of the detection of one photon, only the presence or absence (0 or 1) of a signal is decided. Accordingly, the degradation of linearity does not become a problem. In other words, the example where a common-source amplifier transistor is provided to a pixel is especially suitable to the detection of one photon. Moreover, in the example, the increase of random noise with the addition of an extra transistor and circuit (for example, the addition of the amplifier circuit 460 illustrated in FIG. 12) does not occur either.

FIG. 19 illustrates an example where the constant current source 819 and the power (power supplied to the pixel via the power line 323 (a power supply voltage)) of the pixel are separated. In FIG. 19, it is assumed to use a PMOS transistor as the constant current source 819 in saturation region. In this case, the source potential of the constant current source 819 is made higher than the power supply potential of a pixel supplied to the pixel via the power line 323. Accordingly, it is possible to ensure an operating point suitable for amplification.

In FIG. 19, the example where the common-source amplifier transistor 811 is configured of a general NMOS transistor was described. However, even if a PMOS transistor is used, a common-source amplifier transistor can be provided to a pixel. In this case, it becomes unnecessary to make the source potential of the constant current source higher than the power supply potential of the pixel, which facilitates the setting of the source potential of the constant current source. Next, an example where the common-source amplifier transistor 811 is configured of a PMOS transistor is described with reference to FIG. 20.

FIG. 20 is a schematic diagram illustrating an example of a circuit configuration of a pixel (the pixel 820) in an example where a common-source PMOS transistor illustrated as a sixth modification of the first embodiment of the present technology is provided as an amplifier transistor to the pixel to amplify output from the pixel.

The pixel 820 includes an amplifier transistor 821 configured of a common-source PMOS transistor instead of the amplifier transistor 314 configured of the common-source NMOS transistor of FIG. 19. The configurations of the pixel excluding the amplifier transistor 821 are similar to those of FIGS. 2 and 19. Accordingly, the same reference numerals as those of FIG. 2 are assigned to the configurations. The descriptions of the configurations excluding the amplifier transistor 821 are omitted here.

The amplifier transistor 821 is an amplifier transistor configured of a common-source PMOS transistor. The amplifier transistor 821 is connected at its gate terminal to the FD 322, and at its source terminal to the power line 323 and the drain terminal of the reset transistor 313. Moreover, the amplifier transistor 821 is connected at its drain terminal to a constant current source 829, and a digital value generation circuit via the vertical signal line 341. The amplifier transistor 821 has positive-phase output as in the amplifier transistor 314 of FIG. 2.

In this manner, when a common-source PMOS transistor is provided as an amplifier transistor of a pixel, a general NMOS transistor can be used as a constant current load (a load of the constant current source 829) for a CMOS image sensor. Moreover, as compared to the pixel 810 illustrated in FIG. 19, even if the source potential of the constant current source is not made higher than the power supply potential of the pixel, the operating point can be ensured, which facilitates the setting of the operating point.

In FIGS. 19 and 20, the description was given assuming that a transistor is used for the load of the constant current source. However, if output impedance can be ignored, a resistive element may be used. Moreover, also in this case, the amplification gain of a common-source amplifier transistor can be made sufficiently larger than one.

In this manner, the output of a pixel can be amplified also by providing a common-source amplifier transistor to the pixel.

As illustrated in FIGS. 12 to 20, the output of a pixel can be amplified by various methods. The common-source amplifier transistors illustrated in FIGS. 19 and 20 can amplify the output of a pixel signal easily with a simple structure. However, variations in gain also become very large to obtain a large amplification in an open loop. According to the first embodiment of the present technology, a decision threshold value for the binary decision can be set for each pixel in an imaging device having variations in gain. Accordingly, the adverse effect of variations in gain on photon counting can be reduced. In other words, a binary decision unit that can set a decision threshold value for each pixel is provided to an imaging device including an amplifier unit that amplifies a faint signal. Accordingly, it is possible to prevent an erroneous decision due to a variation in gain by the amplifier unit and detect a faint signal with high accuracy.

In this manner, according to the first embodiment of the present technology, the accuracy of a decision on a photon incident on a pixel can be improved.

2. Second Embodiment

In the first embodiment, the adjustment apparatus 550 obtains a threshold value from no-storage signals of an unexposed signal. However, the adjustment apparatus 550 can also obtain a threshold value from signals of an exposed pixel. The adjustment apparatus 550 of a second embodiment is different from that of the first embodiment in that a threshold value is obtained from signals of an exposed pixel.

Figure 21:
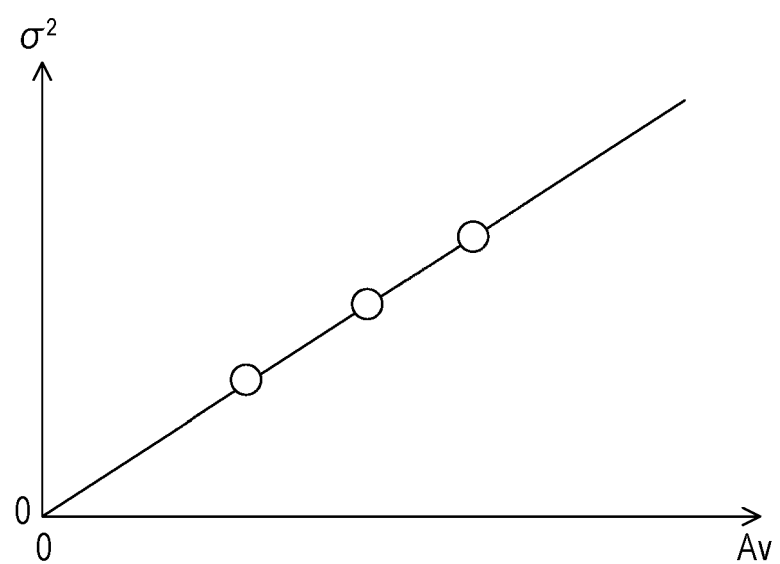
FIG. 21 is a graph illustrating an example of the relationship between the standard deviation and average value of digital values of a second embodiment of the present technology.

FIG. 21 is a graph illustrating an example of the relationship between the standard deviation and average value of digital values in the second embodiment of the present technology. As described above, the signal amount (gradation value) of a storage signal of a pixel to which photons have entered changes in accordance with the conversion efficiency of the stored charge into a digital value. Specifically, the relationship between the signal amount of the storage signal and the number of charges stored is expressed by the following Equation 5.

$$Av = \eta \times N \qquad \text{Equation 5}$$

In Equation 5, Av is the average value of the signal amounts, and N is the number of charges stored. Moreover, η is the conversion efficiency of stored charge into a digital value.

Moreover, generally, as the number of charges stored increases, noise increases and variations in digital values increase. Hence, the following Equation 6 holds.

$$\sigma = \eta \times N^{1/2} \qquad \text{Equation 6}$$

In Equation 6, σ is the standard deviation of the signal amounts, N is the number of charges, and η is the conversion efficiency.

The following Equation 7 is derived from these Equations 5 and 6.

$$\sigma^2 = \eta \times Av \qquad \text{Equation 7}$$

The average value Av and the standard deviation σ have different values depending on the amount of exposure. Therefore, the amount of exposure is changed. A pair of the average value Av and the standard deviation σ is obtained in each amount of exposure. If values of at least two pairs are obtained, the conversion efficiency η can be obtained by a substitution method based on Equation 7.

When the conversion efficiency η is obtained, the adjustment apparatus 550 may use the least square method. Specifically, the adjustment apparatus 550 sets, as a theoretical value, the value of a standard deviation obtained by substituting the measurement value of the average value Av into Equation 7, and calculates the value of the conversion efficiency η where the sum of squares of the difference between the measurement value of the standard deviation σ and the theoretical value becomes a minimum.

FIG. 21 is a graph illustrating an example of the relationship between the average value Av and the standard deviation σ, which is illustrated in FIGS. 7a and 7b. In FIG. 21, the horizontal axis is the average value Av and the vertical axis is the square of the standard deviation σ. White circles on the graph are points obtained by the measurements. A proportional straight line can be obtained from these points based on Equation 7. The gradient of the straight line corresponds to the conversion efficiency η.

Figure 22:
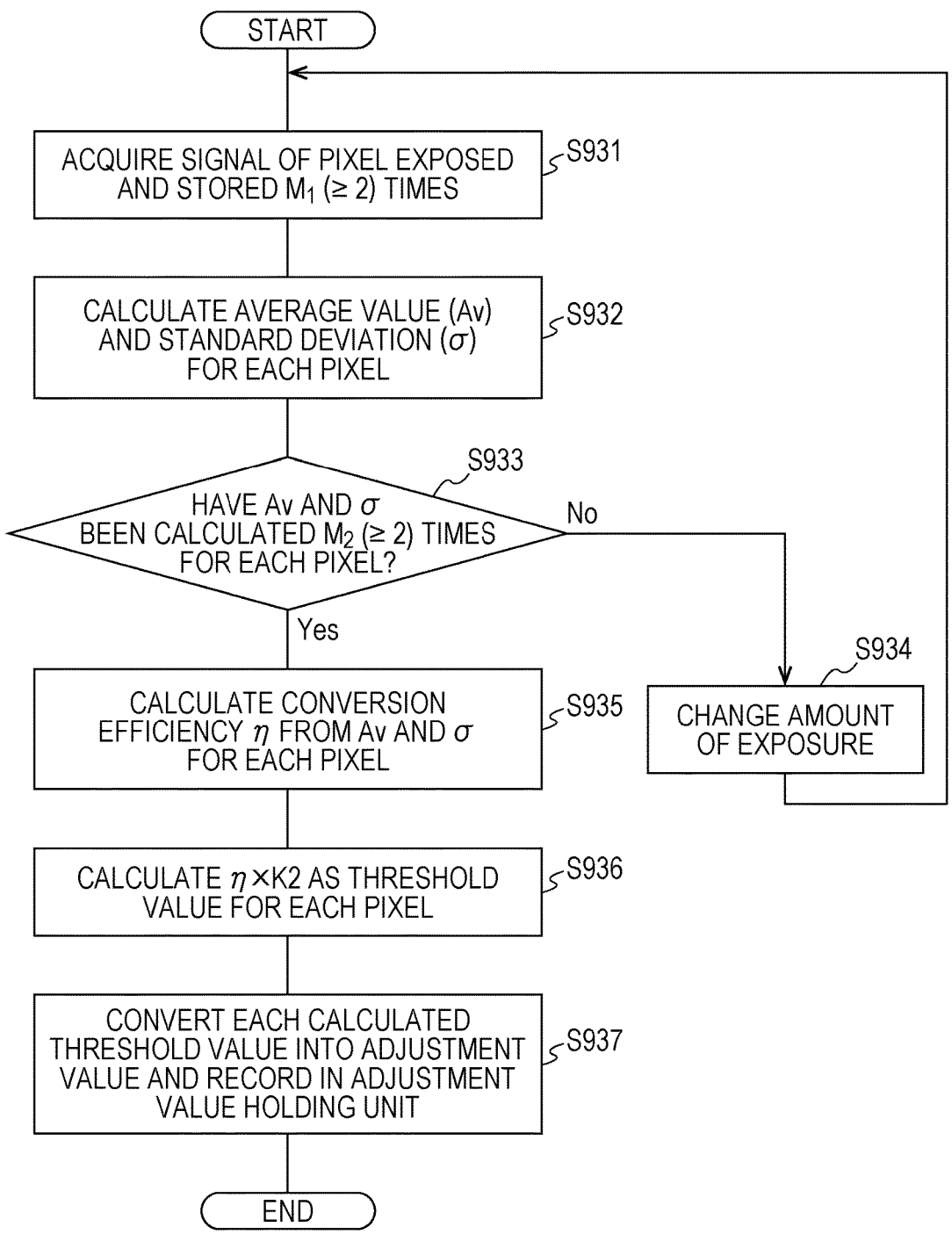
FIG. 22 is a flowchart illustrating an example of a procedure for an adjustment value calculation process by the adjustment value calculation unit 551 of the adjustment apparatus 550 in the second embodiment of the present technology.

FIG. 22 is a flowchart illustrating an example of a procedure for an adjustment value calculation process by the adjustment value calculation unit 551 of the adjustment apparatus 550 in the second embodiment of the present technology. Firstly, the adjustment apparatus 550 performs exposures $M_1$ times with a constant amount of exposure, and acquires a digital value converted from a storage signal of an exposed pixel, $M_1$ times. Here, $M_1$ is an integer of two or more (Step S931).

The adjustment apparatus 550 then calculates, for each pixel, the average value Av and standard deviation σ of digital values in the amount of exposure (Step S932). The adjustment apparatus 550 judges whether or not a pair of the average value Av and the standard deviation σ has been calculated $M_2$ times for each pixel. Here, $M_2$ is an integer of two or more (Step S933).

If the calculation has not been done $M_2$ times (Step S933: No), the adjustment apparatus 550 changes the amount of exposure (Step S934), and returns to Step S931. If the calculation has been done $M_2$ times (Step S933: Yes), the adjustment apparatus 550 calculates the conversion efficiency η based on Equation 7 from a pair of the average Av and the standard deviation σ per amount of exposure (Step S935).

The adjustment apparatus 550 calculates, for each pixel, the value obtained by multiplying η by K2 as a threshold value (Step S936). Here, K2 is a real number and, for example, a value of substantially ½ is set. As the value of K2 is increased, the threshold value is increased and a count loss becomes more difficult to occur while the possibility of an erroneous decision is increased. The value of K2 is set considering which of a count loss and an erroneous decision is given a higher priority. The adjustment apparatus 550 converts each calculated threshold value into an adjustment value and records the adjustment values in the adjustment value holding unit 210 (Step S937).

In this manner, according to the second embodiment of the present technology, the adjustment apparatus 550 calculates the average value and standard deviation of digital values for each amount of exposure, and calculates a threshold value from these values and, accordingly can obtain an accurate threshold value in accordance with the conversion efficiency. With the use of the threshold value, the accuracy of a decision on a photon incident on a pixel can be improved.

The imaging devices illustrated in the embodiments of the present technology can be widely applied as an optical detection unit in a known electronic apparatus provided with a photomultiplier tube, avalanche photodiode, photodiode, or the like. For example, it can be applied to a fluorescence scanner of an imaging plate, and a radiation scintillation counter. In addition, it can also be applied to a detector of a DNA chip, an X-ray imaging apparatus called DR (Digital Radiography), a CT (Computed Tomography) apparatus, a SPECT (Single Photon Emission Tomography) apparatus, and the like. Especially, since it is a CMOS image sensor, it can be mass-produced at low cost. Accordingly, many optical detection units can be provided in electronic apparatuses that could be provided only with a small number of optical detection units due to the high cost of a photomultiplier tube. Therefore, the detection speed can be increased.

For example, if the imaging devices illustrated in the embodiments of the present technology are introduced to a detector of a CT apparatus, scintillation light can be detected with much higher sensitivity than a detector of a known photodiode or the like. Accordingly, it is possible to contribute to an increase in the accuracy of detection and a reduction in exposure due to a reduction in the amount of X ray. The same shall apply to the detection of gamma ray that has conventionally used a photomultiplier tube such as a SPECT or PET.

The effect is not produced only with an electronic apparatus provided with many detection heads. A similar effect can be obtained also with an electronic apparatus using a single detection head. For example, if the present technology is applied to a radiation scintillation dosimeter, a small, light, highly sensitive pocket dosimeter can be fabricated using a cheap semiconductor imaging device.

In the embodiments of the present technology, the example where the imaging device has one binary decision unit was illustrated. However, the number of binary decision units is not limited to the example. For example, the binary decision unit may be provided to each digital value generation circuit 400 provided to each vertical signal line 341 (each column).

Moreover, in the embodiments of the present technology, the example where the amplifier unit that amplifies a signal output by a pixel is only in one stage. However, the number of stages is not limited to the example. Amplifiers may be provided in a plurality of stages to amplify a signal. For example, a case where an amplifier provided to a pixel (the fifth and sixth modifications) and an amplifier provided to each column (the first to fourth modifications) are combined, a case where an amplifier provided to each column is linked across multiple stages, and the like are conceivable.

In the embodiments of the present technology, the description was given on the precondition that a binary decision is made on the "entrance of a photon" and the "non-entrance of a photon". However, when reference signals (REF) of a plurality of systems are prepared, then two or more values can be decided. For example, two systems are prepared for the reference signal (REF). An intermediate value between a digital value at the time when the number of photons is "0", and a digital value at the time when the number of photons is "1" is set for one system. Moreover, an intermediate value between a digital value at the time when the number of photons is "1" and a digital value at the time when the number of photons is "2" is set for the other system (the second system). Consequently, a decision can be made between three alternatives of "0", "1", and "2" for the number of photons. The dynamic range of image capture is widened. At this point in time, the adjustment value holding unit 210 is caused to hold information on a threshold value of the second system. Accordingly, the same execution is possible as in the embodiments of the present technology. The threshold value of the second system can be calculated by, for example, setting the constant K1 of Equation 2 illustrated in FIG. 10 as a constant K1' having a larger value than the constant K1. In a case of an imaging device where gradation values of "0" to "1" and gradation values of "1" to "2" are substantially the same (in a case where amplification has linearity), a value obtained by multiplying the constant K1 by three times may be set as the constant K1'.

The above-mentioned embodiments illustrate examples for embodying the present technology, and matters in the embodiments and matters specifying the invention in the claims share correspondences, respectively. Similarly, the matters specifying the invention in the claims and the matters in the embodiments of the present technology, which are assigned the same names as those of the matters specifying the invention in the claims, share correspondences, respectively. However, the present technology is not limited to the embodiments. The present technology can be embodied by making various modifications to the embodiments within a range that does not depart from a gist of the present technology.

Moreover, the processing procedures described in the above-mentioned embodiments may be understood as a method including these series of procedures, or may be understood as a program for causing a computer to execute these series of procedures or a recording medium where the program is stored. For example, a hard disk, a CD (Compact Disc), an MD (MiniDisc), a DVD (Digital Versatile Disk), a memory card, and a Blu-ray (Blu-ray (registered trademark)) disc can be used as the recording medium.

The present technology can also take the following configurations.

(1) An imaging device including:
a generation unit for generating a digital value indicating the amount of charge stored by photons incident on a pixel during an exposure period, based on a signal output by the pixel; and
a decision unit for comparing a threshold value set for each pixel having similar conversion efficiency at the time of conversion of the amount of charge stored in the pixel into a digital value generated by the generation unit, with the generated digital value, and making a decision on the entrance of a photon into the pixel that output the signal.

(2) The imaging device according to (1), further including an amplification unit for amplifying the signal at a factor greater than one, wherein the generation unit performs the generation based on the amplified signal.

(3) The imaging device according to (2), wherein
the amplification unit is provided to each pixel, and
the decision unit sets a factor at the time of the amplification of the signal as the conversion efficiency, and uses a threshold value set for each pixel to make the decision.

(4) The imaging device according to (3), wherein the amplification unit includes a common-source amplifier transistor provided to each pixel.

(5) The imaging device according to (2), wherein
the amplification units are provided on a column basis to the pixels arranged in matrix form, and
the decision unit sets a factor at the time of the amplification of the signal as the conversion efficiency, and uses a threshold value set on the column basis to make the decision.

(6) The imaging device according to (5), wherein the amplification unit includes an operational amplifier or CMOS (Complementary Metal Oxide Semiconductor) inverter.

(7) The imaging device according to (5), wherein the amplification unit includes a feedback circuit for feeding a potential of the signal back to a potential of a floating diffusion of the pixel that output the signal.

(8) The imaging device according to any of (1) to (7), further including a holding unit for holding a threshold value specifying value for specifying the threshold value with the number of bits less than the number of bits required to indicate the digital value generated by the generation unit, for each pixel having the similar conversion efficiency, wherein the decision unit acquires the threshold value specifying value of the pixel that output the signal converted into the digital value targeted for the decision, converts the acquired threshold value specifying value into a gradation value of the digital value based on a table indicating the association between the digital value and the threshold value specifying value, and sets the threshold value.

(9) The imaging device according to any of (1) to (8), wherein the threshold value is calculated based on a standard deviation and an average value, which are calculated from a plurality of digital values acquired by acquiring a digital value obtained by converting a reset signal being a signal in a state where there is no charge stored by a photon, a plurality of times, for each pixel having the similar conversion efficiency.

(10) An imaging apparatus including:
a generation unit for generating a digital value indicating the amount of charge stored by photons incident on a pixel during an exposure period based on a signal output by the pixel; and
a decision unit for comparing a threshold value set for each pixel having similar conversion efficiency at the time of conversion of the amount of charge stored in the pixel into a digital value generated by the generation unit, with the generated digital value, and making a decision on the entrance of a photon into the pixel that output the signal.

(11) The imaging apparatus according to (10), further including a calculation unit for calculating the threshold value based on a standard deviation and average value of a plurality of digital values acquired by acquiring a digital value obtained by converting a reset signal being a signal in a state where there is no charge stored by a photon, a plurality of times, for each pixel having the similar conversion efficiency.

(12) An electronic apparatus including:
a generation unit for generating a digital value indicating the amount of charge stored by photons incident on a pixel during an exposure period based on a signal output by the pixel; and
a decision unit for comparing a threshold value set for each pixel having similar conversion efficiency at the time of conversion of the amount of charge stored in the pixel into a digital value generated by the generation unit, with the generated digital value, and making a decision on the entrance of a photon into the pixel that output the signal.

(13) A threshold value calculation apparatus including:
an acquisition unit for acquiring a digital value generated by an imaging device, a plurality of times, for each pixel having similar conversion efficiency, the imaging device including
a generation unit for generating a digital value indicating the amount of charge stored by photons incident on a pixel during an exposure period, based on a signal output by the pixel, and
a decision unit for comparing a threshold value set for each pixel having similar conversion efficiency at the time of conversion of the amount of charge stored in the pixel into a digital value generated by the generation unit, with the generated digital value, and making a decision on the entrance of a photon into the pixel that output the signal; and
a calculation unit for calculating the threshold value based on a standard deviation and average value of the acquired digital values.

(14) The threshold value calculation apparatus according to (13), wherein the signal is a reset signal in a state where there is no charge stored by a photon.

(15) The threshold value calculation apparatus according to (13), wherein
the signal is a signal in a state where there is no charge stored by a photon,
the acquisition unit executes the process of acquiring the digital value generated by the exposed imaging device, a plurality of times, with different amounts of exposure, and
the calculation unit calculates the threshold value from the standard deviation and average value obtained for each amount of exposure.

(16) An imaging method including:
a generation procedure of generating a digital value indicating the amount of charge stored by photons incident on a pixel during an exposure period based on a signal output by the pixel; and
a decision procedure of comparing a threshold value set for each pixel having similar conversion efficiency at the time of conversion of the amount of charge stored in the pixel into a digital value generated by the generation procedure, with the generated digital value, and making a decision on the entrance of a photon into the pixel that output the signal.

REFERENCE SIGNS LIST

100 Imaging device
110 Vertical drive circuit
130 Resistor
150 Output circuit
210 Adjustment value holding unit
220 Binary decision unit
300 Pixel array unit
310 Pixel
311 Photodiode
312 Transfer transistor
313 Reset transistor
314 Amplifier transistor
400 Digital value generation circuit
440 Amplifier unit
550 Adjustment apparatus
551 Adjustment value calculation unit

What is claimed is:

1. An imaging device comprising:
a generation unit for generating a digital value indicating the amount of charge stored by photons incident on a pixel during an exposure period, based on a signal output by the pixel; and
a decision unit for comparing a threshold value set for each pixel having similar conversion efficiency at the time of conversion of the amount of charge stored in the pixel into a digital value generated by the generation unit, with the generated digital value, and making a decision on the entrance of a photon into the pixel that output the signal.

2. The imaging device according to claim 1, further comprising an amplification unit for amplifying the signal at a factor greater than one, wherein the generation unit performs the generation based on the amplified signal.

3. The imaging device according to claim 2, wherein
the amplification unit is provided to each pixel, and
the decision unit sets a factor at the time of the amplification of the signal as the conversion efficiency, and uses a threshold value set for each pixel to make the decision.

4. The imaging device according to claim 3, wherein the amplification unit includes a common-source amplifier transistor provided to each pixel.

5. The imaging device according to claim 2, wherein
the amplification units are provided on a column basis to the pixels arranged in matrix form, and
the decision unit sets a factor at the time of the amplification of the signal as the conversion efficiency, and uses a threshold value set on the column basis to make the decision.

6. The imaging device according to claim 5, wherein the amplification unit includes an operational amplifier or CMOS (Complementary Metal Oxide Semiconductor) inverter.

7. The imaging device according to claim 5, wherein the amplification unit includes a feedback circuit for feeding a potential of the signal back to a potential of a floating diffusion of the pixel that output the signal.

8. The imaging device according to claim 1, further comprising a holding unit for holding a threshold value specifying value for specifying the threshold value with the number of bits less than the number of bits required to indicate the digital value generated by the generation unit, for each pixel having the similar conversion efficiency, wherein the decision unit acquires the threshold value specifying value of the pixel that output the signal converted into the digital value targeted for the decision, converts the acquired threshold value specifying value into a gradation value of the digital value based on a table indicating the association between the digital value and the threshold value specifying value, and sets the threshold value.

9. The imaging device according to claim 1, wherein the threshold value is calculated based on a standard deviation and an average value, which are calculated from a plurality of digital values acquired by acquiring a digital value obtained by converting a reset signal being a signal in a state where there is no charge stored by a photon, a plurality of times, for each pixel having the similar conversion efficiency.

10. An imaging apparatus comprising:
a generation unit for generating a digital value indicating the amount of charge stored by photons incident on a pixel during an exposure period based on a signal output by the pixel; and
a decision unit for comparing a threshold value set for each pixel having similar conversion efficiency at the time of conversion of the amount of charge stored in the pixel into a digital value generated by the generation unit, with the generated digital value, and making a decision on the entrance of a photon into the pixel that output the signal.

11. The imaging apparatus according to claim 10, further comprising a calculation unit for calculating the threshold value based on a standard deviation and average value of a plurality of digital values acquired by acquiring a digital value obtained by converting a reset signal being a signal in a state where there is no charge stored by a photon, a plurality of times, for each pixel having the similar conversion efficiency.

12. An electronic apparatus comprising:
a generation unit for generating a digital value indicating the amount of charge stored by photons incident on a pixel during an exposure period based on a signal output by the pixel; and
a decision unit for comparing a threshold value set for each pixel having similar conversion efficiency at the time of conversion of the amount of charge stored in the pixel into a digital value generated by the generation unit, with the generated digital value, and making a decision on the entrance of a photon into the pixel that output the signal.

13. A threshold value calculation apparatus comprising:
an acquisition unit for acquiring a digital value generated by an imaging device, a plurality of times, for each pixel having similar conversion efficiency, the imaging device including
a generation unit for generating a digital value indicating the amount of charge stored by photons incident on a pixel during an exposure period, based on a signal output by the pixel, and
a decision unit for comparing a threshold value set for each pixel having similar conversion efficiency at the time of conversion of the amount of charge stored in the pixel into a digital value generated by the generation unit, with the generated digital value, and making a decision on the entrance of a photon into the pixel that output the signal; and
a calculation unit for calculating the threshold value based on a standard deviation and average value of the acquired digital values.

14. The threshold value calculation apparatus according to claim 13, wherein the signal is a reset signal in a state where there is no charge stored by a photon.

15. The threshold value calculation apparatus according to claim 13, wherein
the signal is a signal in a state where there is no charge stored by a photon,
the acquisition unit executes the process of acquiring the digital value generated by the exposed imaging device, a plurality of times, with different amounts of exposure, and
the calculation unit calculates the threshold value from the standard deviation and average value obtained for each amount of exposure.

16. An imaging method comprising:
a generation procedure of generating a digital value indicating the amount of charge stored by photons incident on a pixel during an exposure period based on a signal output by the pixel; and
a decision procedure of comparing a threshold value set for each pixel having similar conversion efficiency at the time of conversion of the amount of charge stored in the pixel into a digital value generated by the generation procedure, with the generated digital value, and making a decision on the entrance of a photon into the pixel that output the signal.

* * * * *